United States Patent
Hody Le Caer et al.

(10) Patent No.: US 10,953,635 B2
(45) Date of Patent: Mar. 23, 2021

(54) LAMINATED GLAZING WITH COLOURED REFLECTION AND HIGH SOLAR TRANSMITTANCE SUITABLE FOR SOLAR ENERGY SYSTEMS

(71) Applicant: SWISSINSO SA, Lausanne (CH)

(72) Inventors: Virginie Hody Le Caer, Bussigny-pres-Lausanne (CH); Andreas Schuler, Lausanne (CH)

(73) Assignee: SWISSINSO SA

( * ) Notice: Subject to any disclaimer, the term of this patent is extended or adjusted under 35 U.S.C. 154(b) by 59 days.

(21) Appl. No.: 16/044,680

(22) Filed: Jul. 25, 2018

(65) Prior Publication Data

US 2019/0081588 A1   Mar. 14, 2019

Related U.S. Application Data

(63) Continuation of application No. 14/429,293, filed as application No. PCT/IB2013/058115 on Aug. 29, 2013, now abandoned.

(30) Foreign Application Priority Data

Sep. 20, 2012  (WO) .................. PCT/IB2012/055000

(51) Int. Cl.
*B32B 17/10* (2006.01)
*F24S 80/52* (2018.01)
(Continued)

(52) U.S. Cl.
CPC .......... *B32B 17/10201* (2013.01); *B32B 7/02* (2013.01); *B32B 17/064* (2013.01);
(Continued)

(58) Field of Classification Search
None
See application file for complete search history.

(56) References Cited

U.S. PATENT DOCUMENTS 3,573,156 A   3/1971  Reilly
4,055,458 A  10/1977  Niederprum et al.
(Continued)

FOREIGN PATENT DOCUMENTS

| EP | 0964288 | 12/1999 |
|---|---|---|
| JP | S62-213283 | 9/1987 |
| WO | WO 2004/079278 | 9/2004 |

OTHER PUBLICATIONS

Dobrowolski, J.A.(eds. Bass et al.). "Chapter 42: Optical Properties of Films and Coatings", Handbook of Optics, vol. I: Fundamentals, Techniques, and Design, (1995); pp. 42.3-42.130.*
(Continued)

*Primary Examiner* — Prashant J Khatri
(74) *Attorney, Agent, or Firm* — Yakov Sidorin; Quarles & Brady LLP

(57) ABSTRACT

A laminated and etched glazing unit having a substrate and a multi-layered interference filter each delimited by two main faces; the incident medium having a refractive index $n_{inc}=1$, the substrate having a refractive index $n_{substrate}$ defined as: $1.45 \leq n_{substrate} \leq 1.6$ at 550 nm, and the exit medium being defined as follows $1.45 \leq n_{exit} \leq 1.6$ at 550 nm; and wherein the following requirements are met: The saturation of the colour is higher than 8 at near-normal angle of reflection, except for grey and brown; the visible reflectance is higher than 4%; the variation of the dominant wavelength $\Delta_{MD}$ of the dominant colour $M_D$ of the reflection is smaller than 15 nm for $\theta_r<60°$; and the total hemispherical solar transmittance is above 80%.

18 Claims, 27 Drawing Sheets

Figure 1:
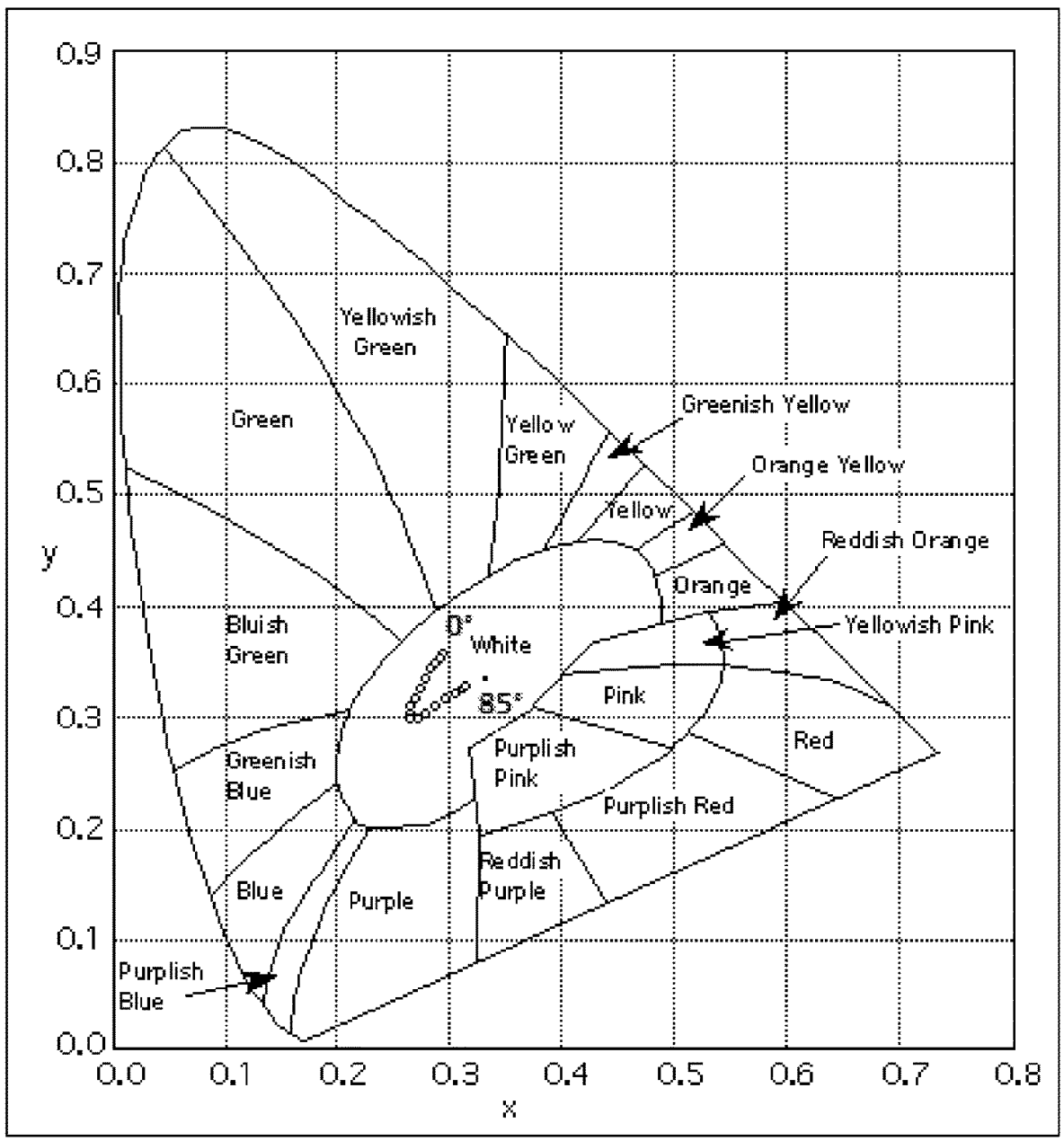

(51) Int. Cl.
  *G02B 5/28* (2006.01)
  *H02S 20/23* (2014.01)
  *H02S 20/26* (2014.01)
  *B32B 7/02* (2019.01)
  *B32B 17/06* (2006.01)
  *H01L 31/048* (2014.01)

(52) U.S. Cl.
  CPC ........ *B32B 17/10* (2013.01); *B32B 17/10036* (2013.01); *B32B 17/10146* (2013.01); *B32B 17/10743* (2013.01); *B32B 17/10761* (2013.01); *B32B 17/10788* (2013.01); *F24S 80/52* (2018.05); *G02B 5/281* (2013.01); *G02B 5/286* (2013.01); *H01L 31/0488* (2013.01); *H02S 20/23* (2014.12); *H02S 20/26* (2014.12); *B32B 2307/418* (2013.01); *B32B 2367/00* (2013.01); *B32B 2457/00* (2013.01); *Y02B 10/10* (2013.01); *Y02E 10/40* (2013.01); *Y10T 428/2495* (2015.01); *Y10T 428/24355* (2015.01); *Y10T 428/24942* (2015.01); *Y10T 428/24967* (2015.01)

(56) References Cited

U.S. PATENT DOCUMENTS

| | | | |
|---|---|---|---|
| 4,582,624 | A | 4/1986 | Enjo et al. |
| 4,896,928 | A | 1/1990 | Perilloux et al. |
| 4,944,986 | A | 7/1990 | Zuel |
| 5,091,053 | A | 2/1992 | Blonder et al. |
| 5,120,605 | A | 6/1992 | Zuel et al. |
| 5,281,350 | A | 1/1994 | Gimm et al. |
| 5,318,830 | A | 6/1994 | Takamatsu et al. |
| 6,391,400 | B1 | 5/2002 | Russell et al. |
| 7,276,181 | B2 | 10/2007 | Miwa |
| 2008/0316594 | A1* | 12/2008 | Hashiguchi ............ G02B 5/281 359/359 |
| 2009/0101192 | A1 | 4/2009 | Kothari et al. |
| 2011/0096555 | A1 | 4/2011 | Pires et al. |
| 2011/0232213 | A1 | 9/2011 | Jousse et al. |
| 2012/0052244 | A1 | 3/2012 | Schoenberger et al. |
| 2015/0249424 | A1 | 9/2015 | Hody Le Caer et al. |
| 2017/0123122 | A1* | 5/2017 | Ballif ...................... G02B 5/26 |

OTHER PUBLICATIONS

Thelen, A. "Multilayer Filters with Wide Transmission Bands", Journal of the Optical Society of America, vol. 53, No. 11, (1963); pp. 1266-1270.*

Bezuidenhout et al. "The optical properties of evaporated Y2O3 films", Thin Sold Films, vol. 139, Issue 2, (1986); Abstract.*
Ramana et al. "Enhanced optical constants of nanocrystalline yttrium oxide thin films", Applied Physics Letters, 98, (2011); pp. 031905.1-031905.3.*
Schulz et al. "Antireflection of transparent polymers by advanced plasma etching procedures", Optics Express, vol. 15, No. 20, (2011); pp. 13108-13113.*
International Search Report for International (PCT) Patent Application No. PCT/IB13/58115, dated Mar. 17, 2014, 4 pages.
Written Opinion for International (PCT) Patent Application No. PCT/IB13/58115, dated Mar. 17, 2014, 7 pages.
International Preliminary Report on Patentability for International (PCT) Patent Application No. PCT/IB13/58115, dated Mar. 24, 2015, 7 pages.
Official Action for Australian Patent Application No. 2013319925, dated Mar. 4, 2016, 3 pages.
Official Action for Australian Patent Application No. 2013319925, dated Nov. 12, 2016, 3 pages.
Official Action (with English Translation) for Chinese Patent Application No. 2013800489806, dated Jan. 6, 2016, 10 pages.
Macleod, "Thin Film Optical Filters," Institute of Physics Publishing, 1969, abstract only, 2 pages.
"CIE Recommendations on Colorimetry," 1986, CIE Publication 15.2, 2nd ed., 1 page.
CIE Technical Report, Colorimetry, 3rd ed. Publication 15:2004, 82 pages.
Probst et al., "Towards an improved architectural quality of building integrated solar thermal systems (BIST)," Solar Energy, 2007, vol. 81(9), pp. 1104-1116, abstract only, 2 pages.
Boudaden et al., "Towards coloured glazed thermal solar collectors," Solar Energy Materials & Solar Cells, 2004, vol. 84(1-4), pp. 225-239, abstract only, 3 pages.
Schüler et al., "On the feasibility of colored glazed thermal solar collectors based on thin film interference filters," Solar Energy Materials and Solar Cells, 2004, vol. 84(1-4), pp. 241-254, abstract only, 3 pages.
Schüler et al., "Potential of quarterwave interference stacks for colored thermal solar collectors," Solar Energy, 2005, vol. 79(2), pp. 122-130.
Schüler et al., "Thin film multilayer design types for colored glazed thermal solar collectors," Solar Energy Materials & Solar Cells, 2005, vol. 89(2-3), pp. 219-231, abstract only, 3 pages.
Official Action for U.S. Appl. No. 14/429,293, dated Jun. 15, 2017, 18 pages.
Official Action for U.S. Appl. No. 14/429,293, dated Jan. 29, 2018 15 pages.

* cited by examiner

LAMINATED GLAZING WITH COLOURED REFLECTION AND HIGH SOLAR TRANSMITTANCE SUITABLE FOR SOLAR ENERGY SYSTEMS

CROSS REFERENCE TO RELATED APPLICATIONS

This application is a continuation application of application Ser. No. 14/429,293 having a filing date of Mar. 18, 2015, which application is a national stage application under 35 U.S.C. 371 and claims the benefit of PCT Application No. PCT/IB2013/058115 having an international filing date of 29 Aug. 2013, which designated the United States, which PCT application claimed the benefit of International Application No. PCT/IB2012/055000 filed Sep. 20, 2012, the disclosures of each of which are incorporated herein by reference.

FIELD OF THE INVENTION

The invention deals with coloured laminated glazing suitable for solar energy systems offering architectural integration of solar energy systems, e.g. as solar active glass facades.

Definitions

Direct Transmittance

If parallel beams of radiation incident on a surface, an interface, or a specimen result in transmitted parallel beams, the transmittance is considered as direct. This is the case e.g., for flat surfaces or interfaces.

Diffuse Transmittance

If parallel beams of radiation incident on a surface, an interface, or a specimen result in a more or less wide angular distribution of transmitted beams, the transmittance is considered as diffuse. This is the case e.g., for rough surfaces or interfaces, or for specimens of granular structure. In general, the diffuse transmittance depends on the angle of incidence and the wavelength $\lambda$ of the radiation. If the angle of incidence is not explicitly mentioned, commonly normal incidence is assumed.

Total Hemispherical Transmittance

The total hemispherical transmittance is obtained by the sum of direct transmittance and diffuse transmittance.

$$T_{total} = T_{direct} + T_{diffuse}$$

In general, the total hemispherical transmittance depends on the angle of incidence and the wavelength $\lambda$ of the radiation. If the angle of incidence is not explicitly mentioned, commonly normal incidence is assumed.

Solar Transmittance $T_{sol}$

Given a calculated or measured spectrum of the total hemispherical transmittance of a sample $T(\lambda)$, the solar transmittance $T_{sol}$ is obtained by integration with the solar spectrum $I_{sol}(\lambda)$:

$$T_{sol} = \frac{\int T(\lambda) \cdot I_{sol}(\lambda) d\lambda}{\int I_{sol}(\lambda) d\lambda}$$

where usually the solar spectrum at air mass 1.5 (AM1.5) is employed as intensity $I_{sol}(\lambda)$.

Visible Reflectance $R_{vis}$

The visible reflectance $R_{vis}$ is a measure for the brightness of a surface as it appears to the human eye under certain illumination conditions. A white surface or a perfect mirror exhibits 100% visible reflectance, coloured or grey surfaces less. The determination of the visible reflectance $R_{vis}$ is based on the photopic luminous efficiency function $V(\lambda)$ and depends on the choice of the illuminant $I_{ILL}(\lambda)$:

$$R_{vis} = \frac{\int R(\lambda) \cdot I_{ILL}(\lambda) \cdot V(\lambda) d\lambda}{\int I_{ILL}(\lambda) \cdot V(\lambda) d\lambda}$$

where $R(\lambda)$ is the simulated or measured hemispherical reflectance of the sample.

Angle of Reflection

Figure 29:
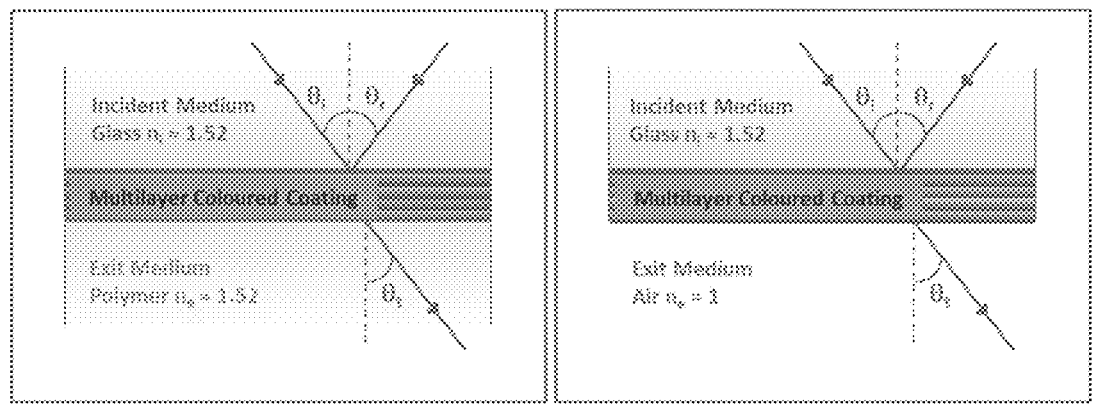

With reference to FIG. 29, the angle of reflection $\theta_r$ is the angle formed by a ray of light reflected from a surface and a line perpendicular to the surface at the point of reflection. Here $\theta_i$ and $\theta_t$ correspond respectively to the incidence and transmission angles.

Refractive Index and Extinction Coefficient

When light passes through a medium, some part of it will always be absorbed. This can be conveniently taken into account by defining a complex index of refraction N:

$$N = n - ik \qquad [1]$$

where the real part n (refractive index) indicates the phase speed, while the imaginary part k (extinction coefficient) indicates the amount of absorption loss when the electromagnetic wave propagates through the material.

Antireflection

A treated surface is considered as antireflective when the solar transmittance of a light beam at near-normal incidence is higher than for an untreated surface.

CIE 1931 XYZ Colour Space

The International Commission on Illumination (CIE, Commission Internationale d'Eclairage) described how to quantify colours [2]. All existing colours can be represented in a plane and mapped by Cartesian coordinates, as shown in the CIE Chromaticity Diagrams. The quantification is based on the 1931 CIE Colour Matching Functions, $x(\lambda)$, $y(\lambda)$, and $z(\lambda)$, which reflect the colour sensitivity of the human eye. These functions depend to some extent on the width of the observation field (we will use the functions for an opening angle of 2°).

CIE 1976 (L*, a*, b*) Colour Space (Or CIELAB)

CIE L*a*b* is the most complete colour model used conventionally to describe all the colours visible to the human eye. It was developed for this specific purpose by the International Commission on Illumination (Commission Internationale d'Eclairage). The three parameters in the model represent the lightness of the colour (L*, L*=0 yields black and L*=100 indicates white), its position between magenta and green (a*, negative values indicate green while positive values indicate magenta) and its position between yellow and blue (b*, negative values indicate blue and positive values indicate yellow).

Dominant Colour

The dominant wavelength of a colour is defined as the wavelength of the monochromatic stimulus that, when additively mixed in suitable proportions with the specified achromatic stimulus, matches the considered colour stimulus [3]. Thus any colour can be related to a monochromatic dominant colour $M_D$ defined by its wavelength $\lambda_D$.

Colour Saturation

The colour saturation is a measurement of how different from pure grey the colour is. Saturation is not really a matter of light and dark, but rather how pale or strong the colour is. The saturation of a colour is not constant, but it varies depending on the surroundings and what light the colour is seen in and is given by:

$$C^*_{ab} = \sqrt{(a^*)^2 + (b^*)^2}$$

where a* and b* are the CIE colour coordinates under daylight illumination CIE-D65.

STATE OF THE ART

The acceptance of solar energy systems as integrated elements of the building's envelope is mainly limited by their unpleasant visual aspect. They are often considered as technical components to be hidden and confined to roof-top applications, where they are less visible and have less impact on the architectural design [4]. The development of better-looking solar systems could open up new perspectives for the architectural integration of solar energy systems, e.g. as solar active glass facades. One solution is to apply a coloured interferential thin film to the inner side of the glazing of the solar system. The coating reflects a colour, thus hiding the technical part of the solar device, but transmits the complementary spectrum. Coloured glass panes based on dielectric thin films multi-depositions have been demonstrated to be of special interest for solar thermal collectors [5-8] and has been the subject to a PCT application in 2004 [9]. The invention disclosed in this PCT application had, however, some weaknesses dealing with:

The security: the invention considered the use of non-tempered, non-laminated glazing that did not fulfill the security requirements for facade installation. Therefore the coloured designs calculated for single glazing (exit medium air $n_{exit}=1$) are not suitable for laminated glazing (exit medium polymer $1.45 \leq n_{exit} \leq 1.6$ at 550 nm).

Figure 2:
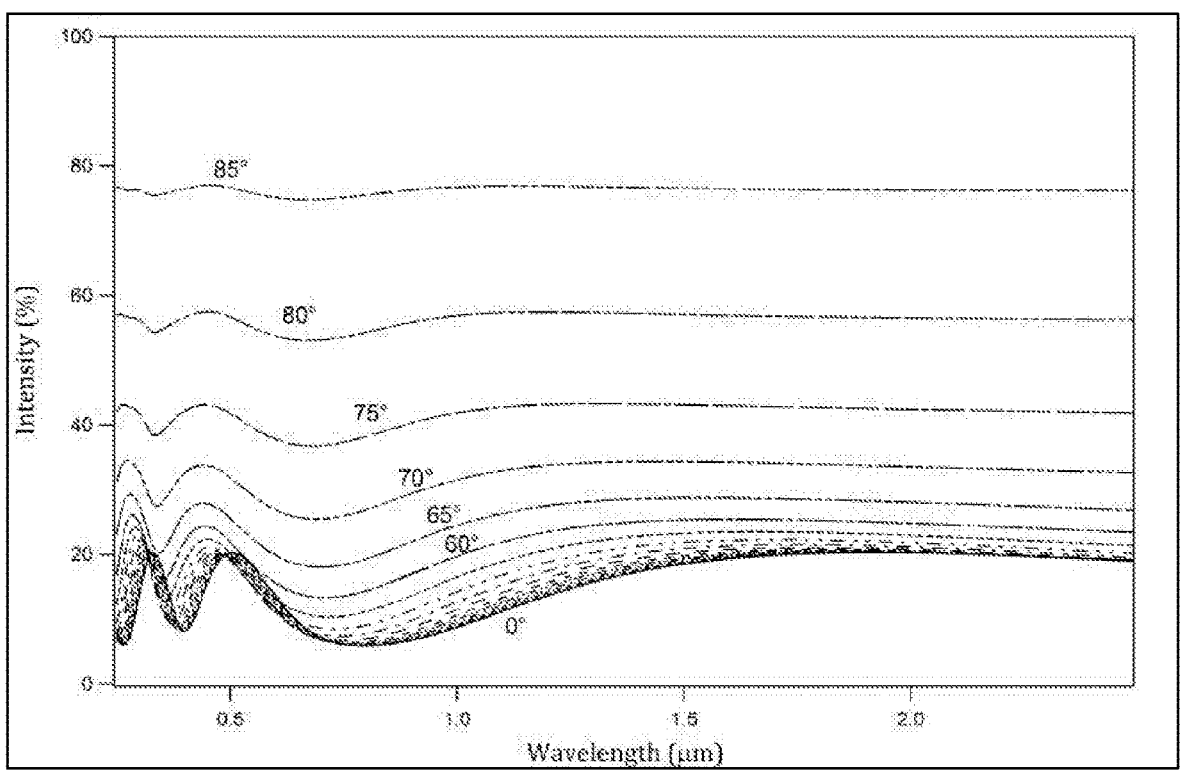

The colour stability: in the context of the 2004 PCT application, the colour was based on quarter wave interference stacks exhibiting narrow reflection peaks. By limiting the number of individual layers and choosing the refractive indices of the involved materials, reasonable amplitudes of the reflection peak were obtained, thus providing excellent solar transmittance to the coating. However, as the narrow reflection peak shifts to smaller wavelength with increasing angle of reflection, the former developed colours (except blue) were dependant on the angle of vision/observation/reflection. Example 1 presents a green design which shifted to blue for increasing angles of observation (see FIG. 1, FIG. 2 and Table 1).

The industrial scale production: relatively thick (>100 nm) $SiO_2$ layers were needed in the coating stacks, thus limiting the production speed of coloured glasses on industrial scale.

The PCT application also referred to the possibility of applying a surface treatment (hot patterning, acid etching, sand or stone projections . . . ) on the outer side of the collector glazing to in order to create a diffuse light transmittance. This treatment has the effect of reinforcing the masking effect of the solar device technical parts, preventing glare effects and producing mat surfaces that are in high demand in today's architecture. Amongst available diffusive surface treatments, acid etching is undoubtedly the most suitable and most widely used treatment at industrial level.

Historically, acidic etching treatments of glasses are performed by using fluoridric-acid-based-solutions [10]. Fluoridric acid is a strong chemical agent responsible of various problems in terms of safety, health of workers and environmental pollution. For this reason, the use of buffered solutions (in which a part of the fluoridric acid is replaced by fluoride salts such as ammonium bifluoride) [11-13] or solutions based on fluoride salts [14-15], less aggressive and more environmentally friendly, are becoming more common.

GENERAL DESCRIPTION OF THE INVENTION

Figure 3A:
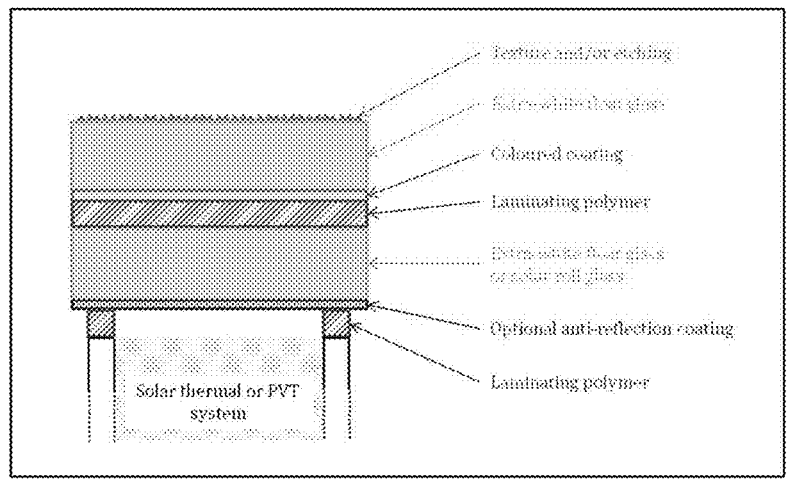
Figure 3B:
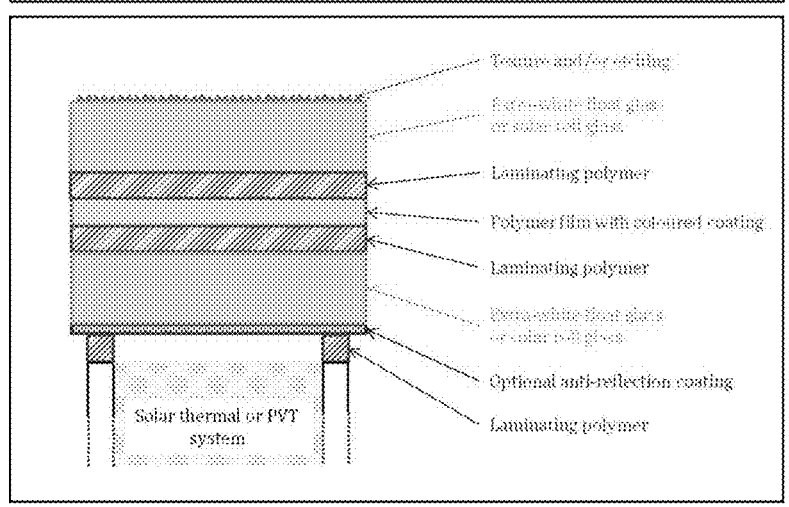
Figure 3C:
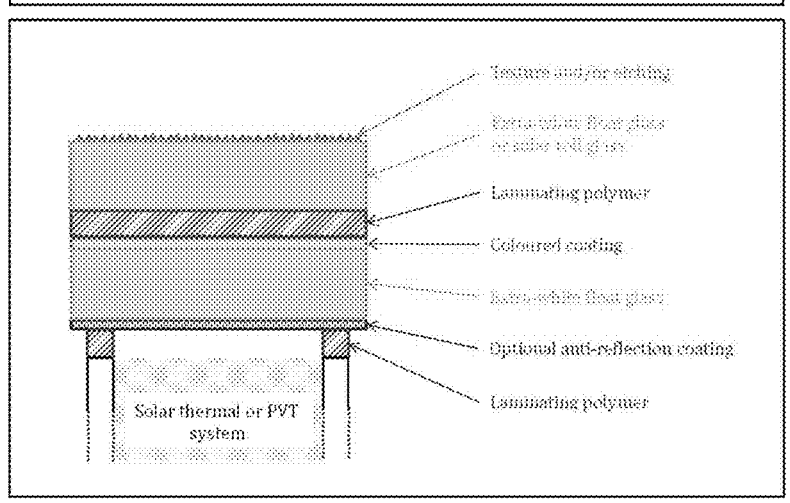
Figure 4A:
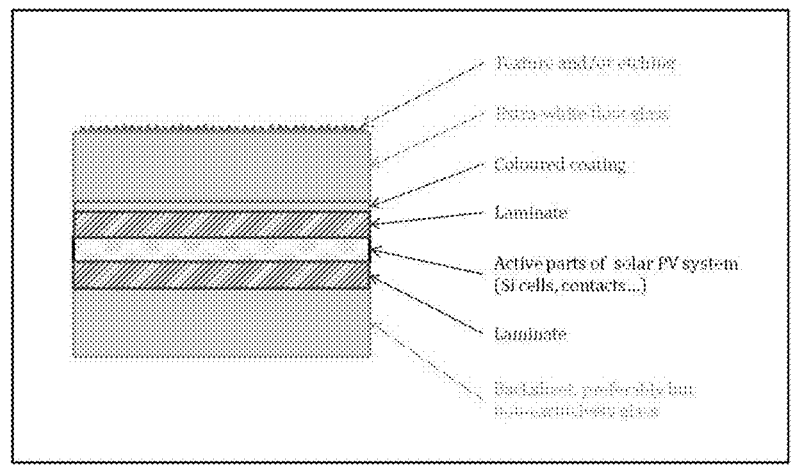
Figure 4B:
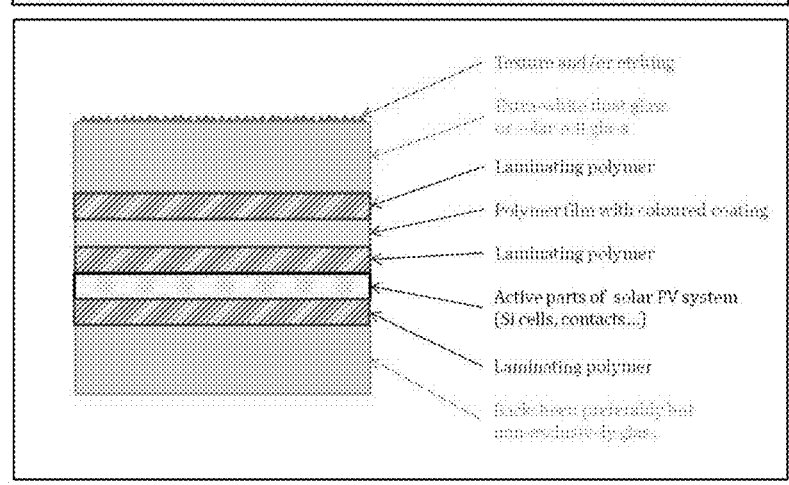
Figure 4C:
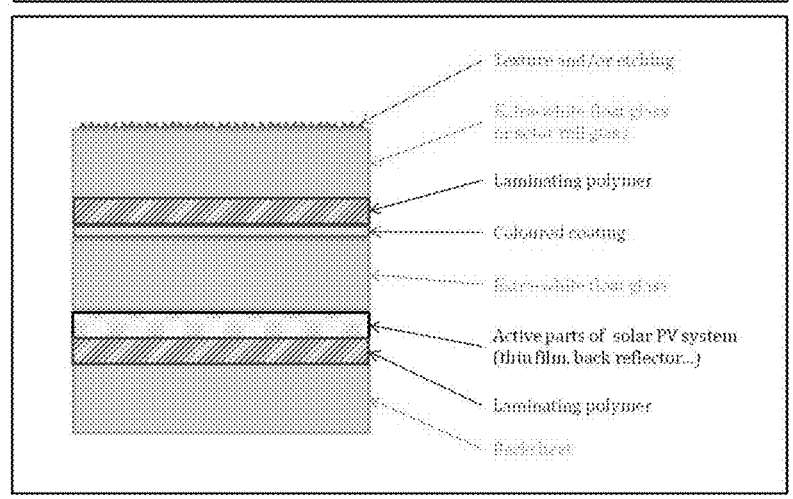

The problems mentioned in the previous chapter have been solved with the present invention which relates to a solar glazing unit as defined in the claims. The present innovation deals with coloured laminated glazing (preferably, but not exclusively, made of glass) with enhanced masking effect, angular colour stability, energetic performances and mechanical stability. The coloured laminated glazing system is schematised in FIG. 3 and can be described as the combination of:

An encapsulated coloured interferential multi-layered coating, deposited on the back side of the outer glass (FIGS. 3a and 4a), on the back or the front side of a polymeric film which is encapsulated between two glass panes (FIGS. 3b and 4b) or on the front side of the inner glass (FIGS. 3c and 4c).

A textured or non-textured diffusive outer surface

An optional anti-reflection coating applied on the back-side of the inner glass for thermal or PVT applications.

Whereas solar thermal or PVT systems are mounted behind or directly glued to the laminated glazing, PV systems are totally integrated into the laminated glazing.

1. Coloured Coating

The choice of the substrate on which the coloured coating is deposited is of main importance. In order to ensure a maximal efficiency of the solar energy system, the substrate has to present a high solar transmittance, thus limiting the possibilities to solar roll glass, extra-white float glass (very low iron-content) or polymeric materials such as polyethylene terephthalate (PET), polyethylene naphtalate (PEN), fluorocarbon polymer (PFA, FEP, ETFE, PTFE . . . ) and so on. The surface flatness is also a critical issue, especially for facade applications. As no colour variation of the interferential coating should be visible, extra-white float glass and polymer materials, giving more freedom in the choice of the glass nature, are preferred to solar roll glass for the deposition of the coloured coating.

The coloured coating consisting in multilayer interferential stacks of transparent layers has to be of high solar transmittance $T_{sol}$. Thus, as absorption in the coating should be minimised, dielectric oxides are preferably chosen. Among the various possibilities, materials such as $SiO_2$, $Al_2O_3$, $MgO$, $ZnO$, $SnO_2$, $HfO_2$, $Nb_2O_5$, $Ta_2O_5$ and $TiO_2$ are for example perfectly suitable for the invention described here.

The visible reflectance $R_{vis}$ is the percentage of light striking the glazing that is reflected back and provides information on the masking capability of the glazing. This value has then to be high enough to permit a good masking effect of the solar energy system technical parts but low enough to ensure a good solar transmittance. Good compromises have then to be found between masking effect and performances of the solar device. In the context of the invention, $R_{vis}$ has to be higher that 4%.

The intensity of the colour is given by its saturation expressed by:

$$C^*_{ab} = \sqrt{(a^*)^2 + (b^*)^2}$$

where a* and b* are CIE colour coordinates under daylight illumination CIE-D65. In order to provide well-visible colours, the colour saturation has to be higher than 8 at near-normal angle of reflection. Exception is made for grey and brown which correspond respectively to strongly desaturated cold and warm colours.

Figure 5:
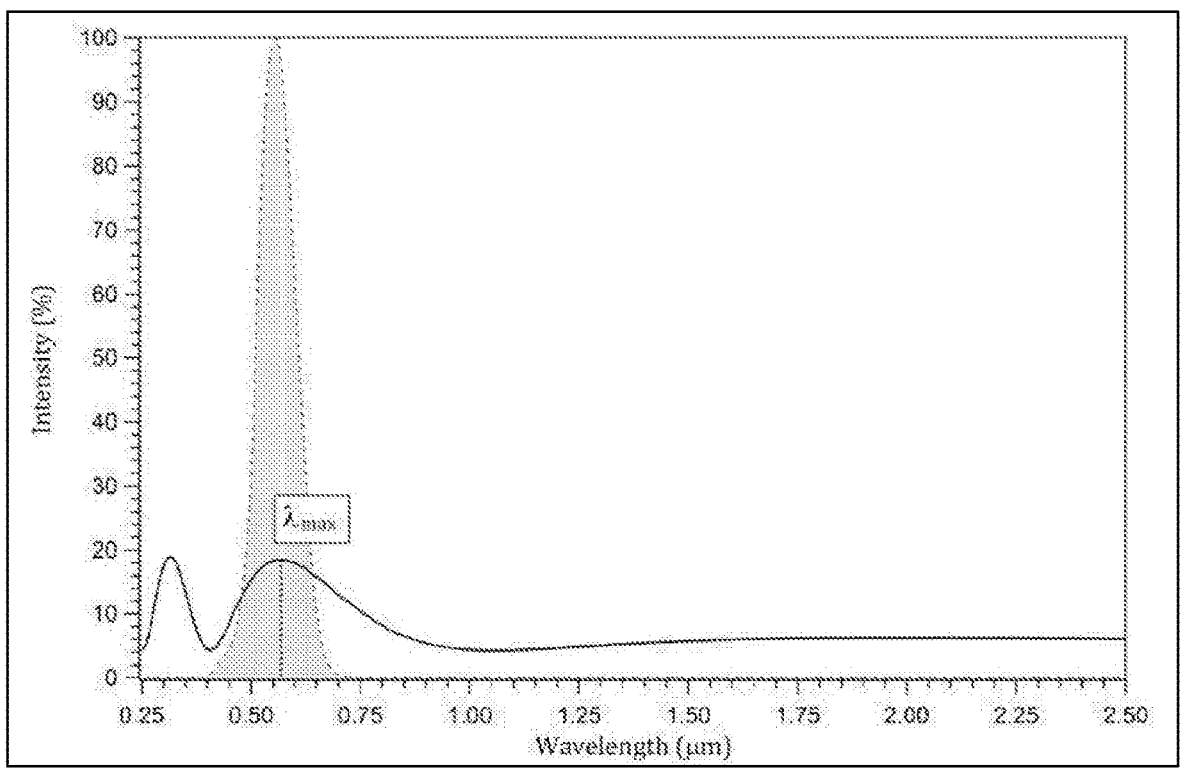

Concerning the colour stability, improvements have been brought here as compared to the 2004 PCT application by modifying the quaterwave interference stacks in order to get asymmetric designs. The consequence of such modifications is the obtaining of reflectance curves characterised either by a large single reflection peak or by several small reflection peaks. Then, the multilayer coating reflects a colour which is defined, as a function of the shape of the reflectance curve:

Either by the wavelength of the maximum intensity of a single reflectance peak situated in the visible part of the solar spectrum. For example, FIG. 5 represents a reflectance curve at normal incidence (angle of vision of 0°) with a maximal intensity at $\lambda_{max}$=570 nm which corresponds to a yellow-green dominant colour for the coating.

Figure 6:
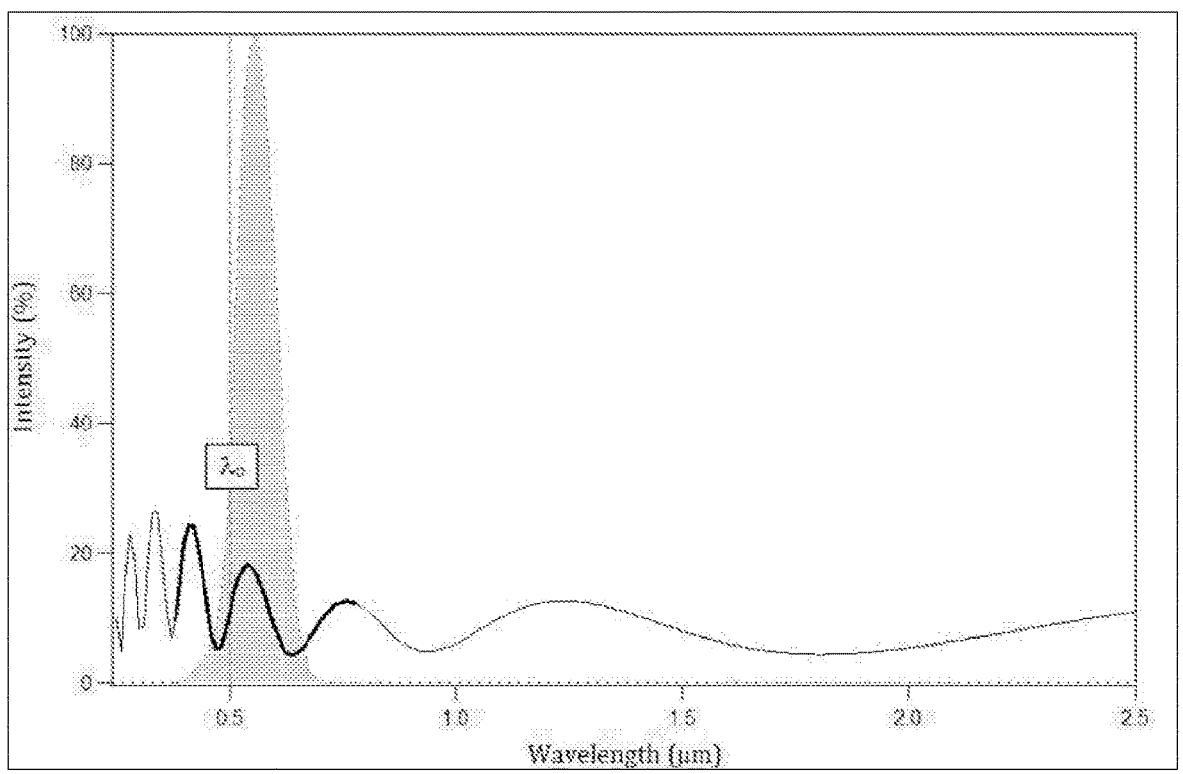

Or by the combination of the wavelengths of 2 or more reflectance peaks situated in the visible spectral region. For example, FIG. 6 shows a reflectance curve at normal incidence with 3 peaks in the visible part of the spectrum and respectively situated at 413 nm, 534 nm and 742 nm. The resultant dominant colour of the considered coating is situated at $\lambda_D$=500 nm (green).

With increasing angle of vision most features of the spectra shift to smaller wavelengths, inducing a modification of the position of $\lambda_{max}$ and thus of the dominant colour of the coating. As example, the reflectance curves obtained for both yellow-green and green coatings at various angles of reflection $\theta_r$ (from 0° to 85°) are given in FIGS. 7(a) and (b) respectively.

Providing coloured glazing with good angular colour stability is of high importance for building integration. Strong efforts have then been made in order to avoid or limit the colour variations. The principle of the colour stability can be explained as follows. Generally, the colour M of a layer can be regarded as a mixture of several colours whatever the shape of its reflectance curve. For more clarity, the explanations will be given for a fictive coloured layer characterized by two reflection peaks, in the visible part of the solar spectrum, whose wavelengths and colours are respectively $\lambda_1$, $C_1$ and $\lambda_2$, $C_2$ (see FIG. 8a). The colour M is defined by a dominant colour $M_D$ whose wavelength $\lambda_{MD}$ comprised between $\lambda_1$ and $\lambda_2$, its position depending on the relative intensity of both reflection peaks (see FIG. 8b). With increasing angles of vision the reflection peaks shift to shorter wavelengths. The shift of $C_1$ to $C_{1'}$ has to be compensated by an equivalent shift of $C_2$ to $C_{2'}$ as well as a modification of the relative intensity of both peaks in order to conserve the position of the point M. At least, the point M has to be kept on the on the colour segment defined by the line $MM_D$. In that last case, the dominant colour of the coating remains the same. This compensation can be achieved by choosing carefully the nature and the thickness of the materials of the individual layers constituting the interferential coloured coating stack.

This principle can be extrapolated to more complex designs characterised by more than two peaks of reflection (see FIG. 9).

Green coloured designs based on this principle are given in Examples 2, 3 and 4 (see FIGS. 10, 11, 12, 13, 14, 15 and tables 2, 3 and 4). The (x,y) colour coordinates under CIE-D65 illuminant, the visible reflectance $R_{vis}$, the solar transmittance $T_{sol}$, the dominant wavelength $\lambda_{MD}$ and colour $M_D$ and colour saturation $C_{ab}^*$ of those 3 coatings are given for different angles of reflection. Corresponding graphical presentations of colour variations are also shown for each design. For each design, only small variations in colour and in reflectance (especially for $\theta_r$ up to 60°) are observed in combination with high solar transmittances (above 80% up to 60°). The variation of the wavelength of the dominant colour observed for these coating designs (9 nm of variation between 0° and 60° for Example 2) is almost 4 times lower than for the 2004 PCT application design (Example 1).

Another advantage here as compared to the 2004 PCT application [6], is that the relatively thick $SiO_2$ coatings have been replaced by other oxides with higher deposition speed. As a matter of facts, multilayer interferential stacks are deposited on industrial scale by in-line magnetron sputtering. For low cost production, the number of sub-layers and the thickness of the individual layers have to be limited.

Other examples of coating designs with various colours in reflection (blue, yellow-green, yellowish-orange, grey and brown) are given in Examples 5 to 9 (see FIGS. 16 to 25 and tables 5 to 9).

2. Diffusive Surface

A diffusive surface treatment is applied on the outer surface of the coloured laminated glazing. The glass substrate can either be extra-white float glass or solar roll glass. Extra-white float glass presents the advantage of having a better flatness and will be preferred for facade applications. Both types of glass are also commercially available with a wide variety of textures and patterns applied on the outer surface. This kind of glass can be used in order to add some relief and get closer to tiles appearance in case of roof applications.

The etching treatment is applied in order to create diffuse light transmittance which reinforces the masking effect of the coloured filter. It also presents the advantage to create mat surfaces often desired by architects and to prevent glare effects.

By choosing appropriate compositions of the etching solution, favourable micro/nano-structures on the treated glass surface can also give rise to anti-reflection properties. For example, the treatment of glass surfaces by acid etching in buffered solutions [13] leads to a particular structure combining micrometric islands with nanometric openings, both uniformly distributed. The resulting low reflectance glass surfaces thus obtained are perfectly suitable for the solar applications described here.

Based on literature [14-15], etching solutions composed of several of the following components have been developed: ammonium bifluoride (ABF), water ($H_2O$), isopropanol (IPA), sugars (sucrose, fructose, etc.). These solutions are particularly effective over a wide range of compositions and for treatment times lower than 20 minutes.

Examples of effective solutions with range of reasonable concentrations are given below:

Solution 1: ABF/IPA/water mixture with the following proportions 10-30 wt. %/20-40 wt. %/balance.

Solution 2: ABF/sucrose/water mixture with the following proportions 15-25 wt %/15-40 wt %/balance.

Figure 26:
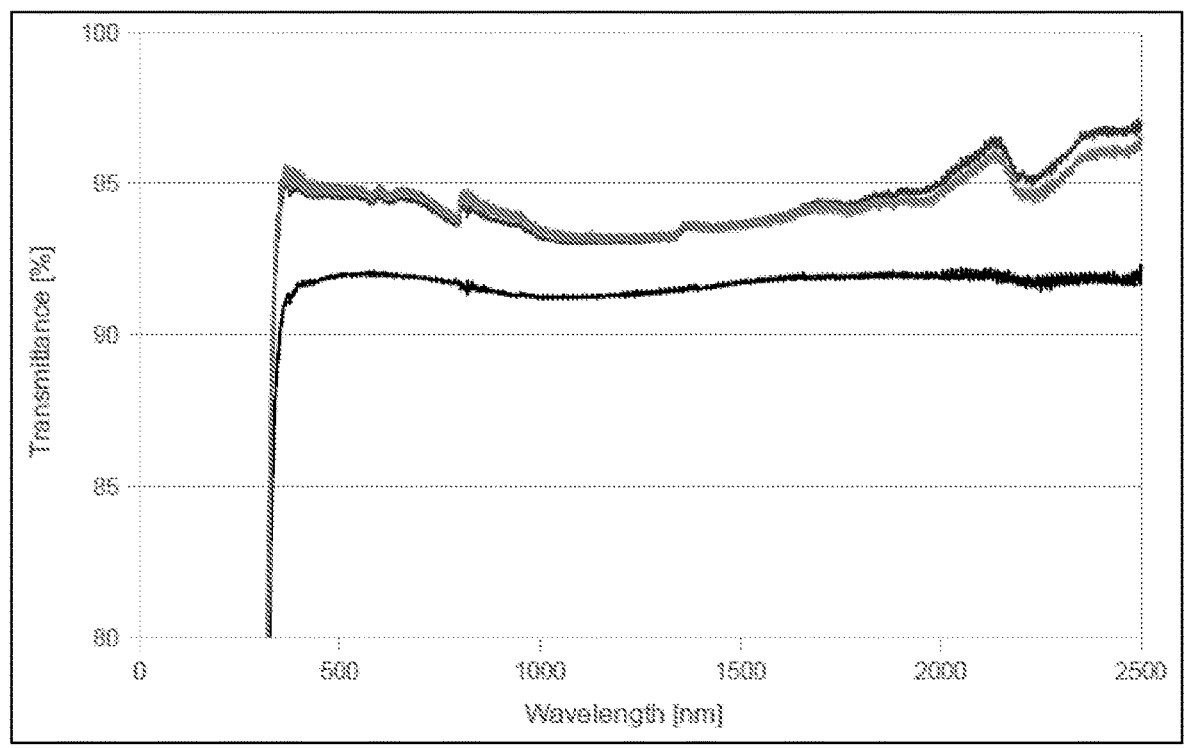

Excellent transmittances are obtained for the treated glass surfaces thanks to anti-reflective properties. The measured hemispherical normal transmittance of the treated glass surfaces is about 95% as regards to 92% for an untreated glass (see FIG. 26).

Figure 27A:
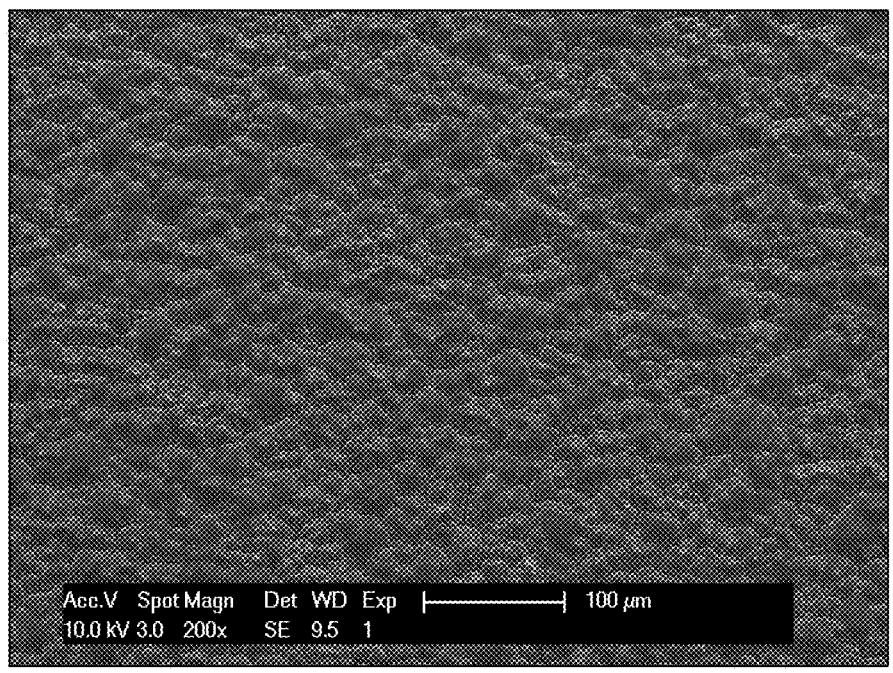

FIGS. 27(a) and (b) present SEM pictures of glass surfaces respectively structured by an ABF/IPA-based etching solution (ABF/IPA/$H_2O$=30/10/60) and by an ABF/sucrose-based etching solution (ABF/sucrose/$H_2O$=18/18/64). Both pictures have been taken for the same etching time (15 min) and at same magnification. In the first case (FIG. 27a), the surface is relatively smooth and presents some micro-scale protrusions and furrows arising from the junction of nano-holes which are present on the entire surface. In the second case (FIG. 27b), the surface features a much rougher structure and is densely covered with some kind of pyramids. These pyramids have a height around 10 µm, are defined by different types of polygons as their base area whose dimensions are often around 100 µm to 120 µm and have pronounced nano-structured side walls. The measured gain in solar transmittance can then be explained by anti-reflective properties resulting from micro-scale patterning in combination with a nano-scale roughness modification.

3. Tempering and Lamination

After coating deposition and etching, the different glass panes are tempered. There is no restriction to perform this thermal treatment, as both coloured coatings (made of oxides) and diffusive surfaces (mainly $SiO_2$) present very good thermal stabilities.

Then, glass panes and if necessary other elements (coated polymeric film, crystalline silicon cells . . . ) are joined together by lamination. Laminating polymers are preferably, but not exclusively elastomer cross-linking products such as EVA (Ethylene-Vinyl-Acetate) or thermoplastic products such as PVB (Polyvinyl Butyral). These products are characterised by high solar transmittances, low refractive indices, and good adhesion to glass or polymer panes.

Both treatments are made and combined in order to fulfill the security requirements for facade applications, but also to provide some advantages. First of all, the lamination can offer the possibility to have different supply chains for coating and etching, depending on the chosen configuration (see FIGS. 3 and 4) thus offering a wide time savings. Moreover the coloured coating is encapsulated, avoiding any colour change due to water condensation on the inner side of the glazing when mounted on thermal collectors.

Another advantage is the good mechanical strength of the laminated glazing which offers:

The possible use of glazing larger than the solar thermal or PVT systems which can be directly bonded to the back of the glazing and thus be completely hidden. Since the coloured coating is encapsulated, such collectors can be obtained without any colour change along the glued collector frame (which is the case when the interferential coating is in direct contact with lamination polymer or glue). Thermal, PV and PVT systems have therefore exactly the same external appearance.

The possible use of the glass for the mechanical fixation of the solar devices.

Figure 28A:
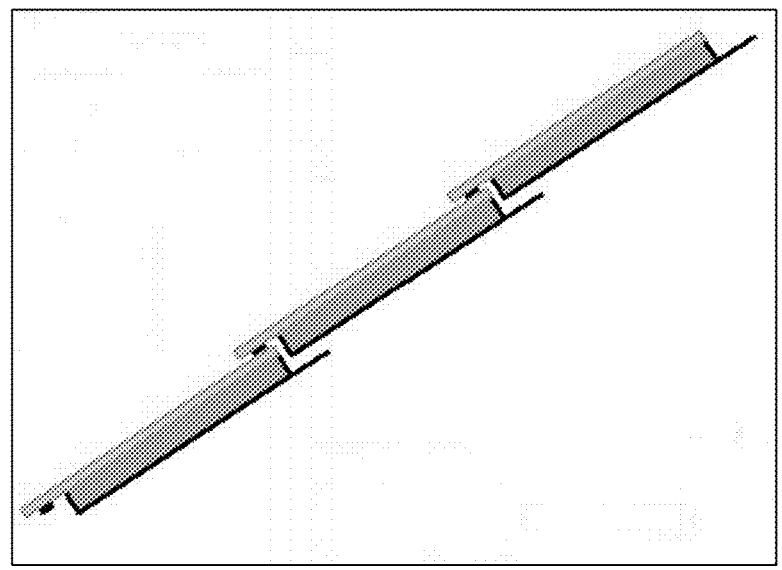
Figure 28B:
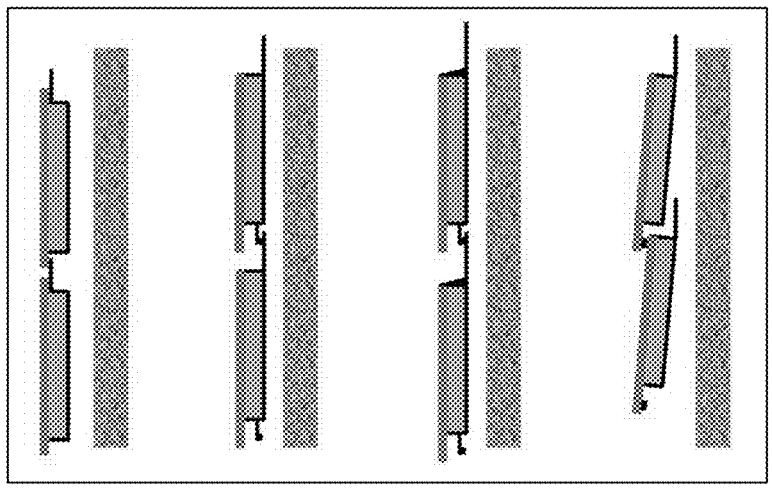

These capabilities allow the production of polyvalent products which provide considerable flexibility for roof and facade installation. As one example, FIG. 28 presents possible variations for the mounting of thermal solar systems glued behind a coloured laminated glazing. In FIG. 28(a), solar thermal collectors are glued on the back of laminated glazing larger than the frame of the collectors. Here the solar collectors are mounted on a roof with glazing overlap and the waterproofing is provided by the presence of seals between two overlapping glazings. Different variations for the mounting of solar thermal collectors in ventilated facade either for residential facade or for large buildings with glass facades are shown respectively in FIGS. 28(b) and (c). Here, the hangers, the overlap wings, the seals and so on can be adaptable to the wishes of the architect, the type and requirements of the building, the local culture of the country, . . . . Same mounting configurations are of course possible for photovoltaic devices, but also for hybrid (combination of thermal and PV devices) roof and facades installations.

4. Optional Anti-Reflection Coating

In order to increase the solar transmittance of solar thermal devices an anti-reflection coating can be applied to the back-side of the inner glass (see FIG. 3).

As a matter of facts, a maximum transmittance value of approximately 92% can be achieved for the best quality glass as a reflectance of 4% on both sides of the glass occurs. By applying an anti-reflection coating characterised by a low refractive index (lower than 1.52) the reflectance of the glass side can be reduced of approximately 3% in the best case.

Ideally, the solar transmittance of the coloured laminated glazing can then increase of approx. 3% and thus compensating the transmittance losses due to the presence of the interferential coloured coating.

REFERENCES

[1] H. A. McLeod, Thin Film Optical Filters, American-Elsevier, New York, 1969.
[2] International Commission on Illumination CIE, 1986. Colorimetry. CIE Publication 15.2, 2nd ed., ISBN 3-900-734-00-3, Vienna
[3] CIE Technical Report (2004) Colorimetry, 3rd ed. Publication 15:2004
[4] M. Munari Probst and C. Roecker, "Towards an improved architectural quality of building integrated solar thermal systems (BIST)," Solar Energy, vol. 81, September 2007, pp. 1104-1116.
[5] A. Schüler, C. Roecker, J.-L. Scartezzini, J. Boudaden, I. R. Videnovic, R. S.-C. Ho, P. Oelhafen, Sol. Energy Mater. Sol. Cells 84 (2004) 241.
[6] J. Boudaden, R. S. C. Ho, P. Oelhafen, A. Schüler, C. Roecker, J.-L. Scartezzini, Solar Energy Materials & Solar Cells 84, 225 (2004).
[7] A. Schüler, C. Roecker, J. Boudaden, P. Oelhafen, J.-L. Scartezzini, Solar Energy 79, 122 (2005).
[8] A. Schüler, J. Boudaden, P. Oelhafen, E. De Chambrier, C. Roecker, J.-L. Scartezzini, Solar Energy Materials & Solar Cells 89, 219 (2005).
[9] A. Schüler, PCT International Publication WO 3004/079278 A1 (2004).
[10] H. Niederprüm, H. G. Klein, J.-N. Meussdoerffer, U.S. Pat. No. 4,055,458 (1977).
[11] N. Enjo, K. Tamura, U.S. Pat. No. 4,582,624 (1986).
[12] G. E. Blonder, B. H. Johnson, M. Hill, U.S. Pat. No. 5,091,053 (1992).
[13] D. C. Zuel, J.-H. Lin, U.S. Pat. No. 5,120,605 (1992).
[14] S. H. Gimm, J. H. Kim, U.S. Pat. No. 5,281,350 (1994).
[15] H. Miwa, U.S. Pat. No. 7,276,181 B2 (2007).

LIST OF FIGURE CAPTIONS

FIG. 1:

Angular dependency of 1931 CIE (x, y) colour coordinates under CIE-D65 illuminant of the coloured design given in Example 1.

FIG. 2:

Reflectance curves of the coating design given in Example 1 for various angles of reflection (from 0° to 85°).

FIGS. 3A, 3B, and 3C:

Schematic drawings of possible configurations of coloured laminated glazing for thermal and PVT applications. The coloured coating can be deposited: FIG. 3A—on the back side of the outer glass, FIG. 3B—on one side of a polymeric film which is encapsulated between two glass panes, FIG. 3C—on the front side of the inner glass.

FIGS. 4A, 4B, and 4C:

Schematic drawings of possible configurations of coloured laminated glazing for PV applications. The coloured coating can be deposited: FIG. 4A—on the back side of the outer glass, FIG. 4B—on one side of a polymeric film which is encapsulated between two glass panes, FIG. 4C—on the front side of the inner glass. Here the technical parts of the PV device are fully integrated into the laminated glazing.

FIG. 5:

1988 C.I.E. normalised photopic luminous efficiency function delimiting the part of the solar spectrum which is visible for the human eye and reflectance curve at normal incidence (angle of vision of 0°) of a yellow-green coating ($\lambda_{max}$=570 nm) presenting a single reflection peak.

FIG. 6:

1988 C.I.E. normalised photopic luminous efficiency function delimiting the part of the solar spectrum which is visible for the human eye and reflectance curve at normal incidence (angle of vision of 0°) of a green coating ($\lambda_D$=500 nm) presenting three reflection peaks in the visible part of the solar spectrum (bulk part of the curve).

Figure 7A:
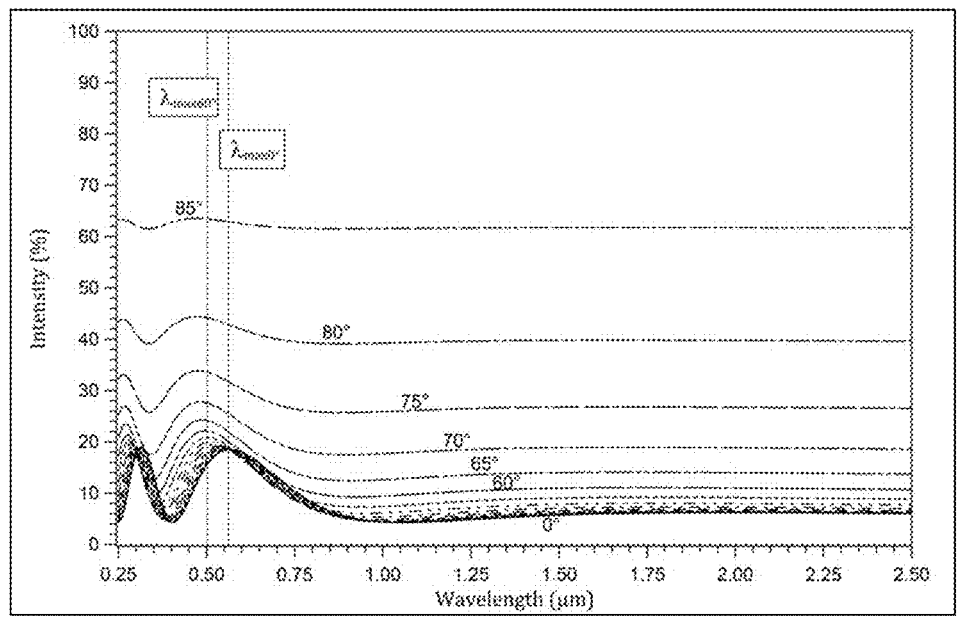

FIGS. 7A, 7B:

FIG. 7A: Reflectance curves of a yellow-green coating for various angles of reflection (from 0° to 85°). The reflection peak situated in the visible part of the spectrum shifts to smaller wavelengths: $\lambda_{max}$ varies from $\lambda_{max\ 0°}$=570 nm to $\lambda_{max\ 60°}$=500 nm leading to a colour change of the coating from yellow-green to green.

Figure 7B:
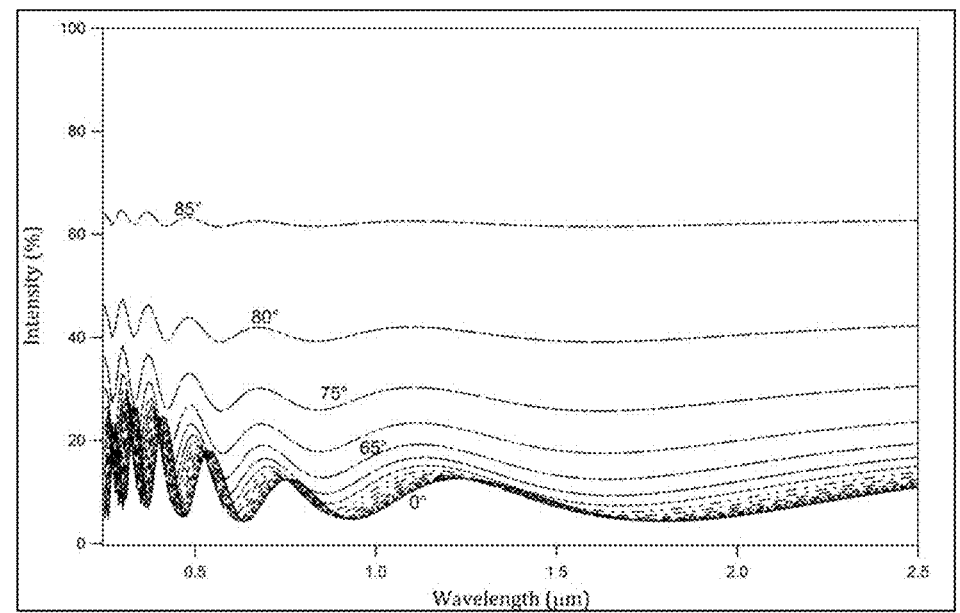

FIG. 7B: Same representation for a green coating design presenting three reflection peaks in the visible part of the solar spectrum.

Figure 8A:
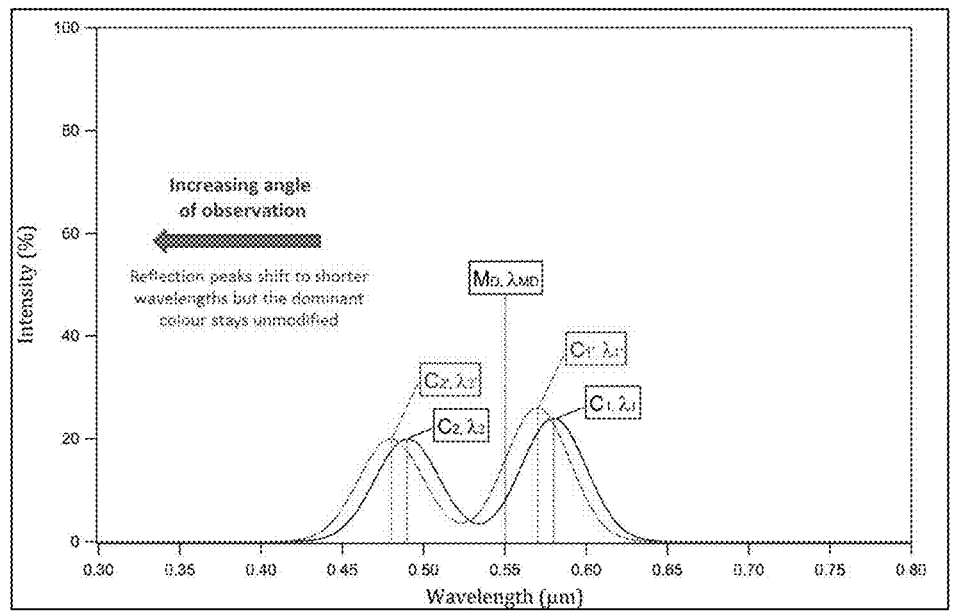

FIGS. 8A, 8B:

FIG. 8A: Graphical representation of a fictive reflectance curve composed by two reflection peaks in the visible part of the solar spectrum. $\lambda_1$, $C_1$ and $\lambda_2$, $C_2$ are the wavelengths and colours of the reflectance peaks at low viewing angle. $\lambda_{1'}$, $C_{1'}$ and $\lambda_{2'}$, $C_{2'}$ are the corresponding wavelengths and colours at higher angle of observation. The dominant colour $M_D$ of the coating is situated at $\lambda_D$ comprised between $\lambda_1$ and $\lambda_2$, its position depending on the relative intensity of both reflection peaks.

Figure 8B:
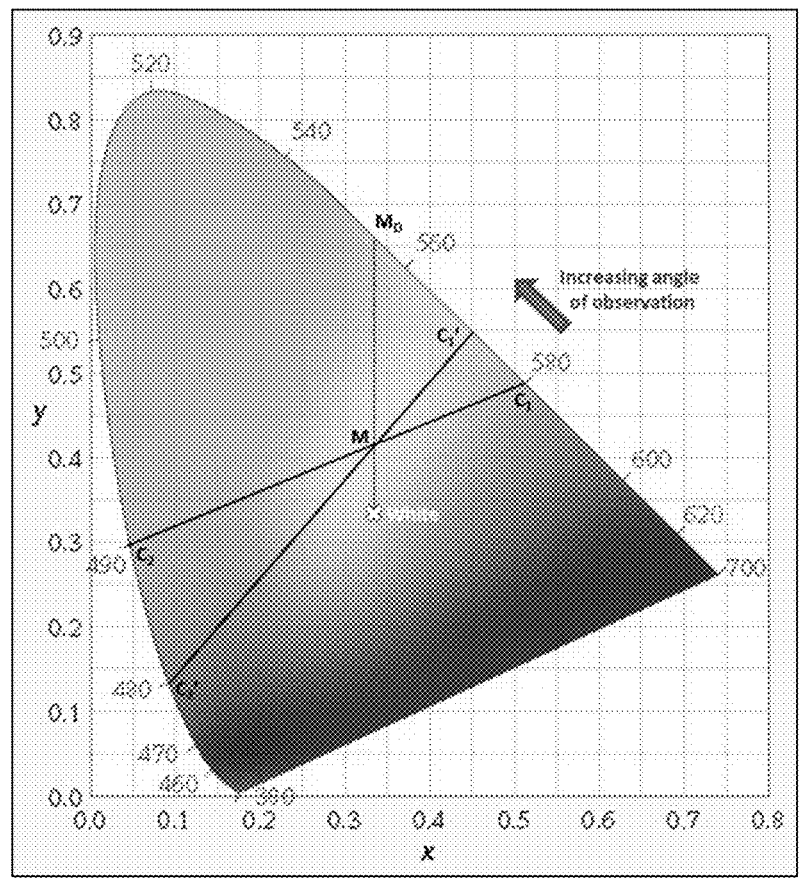

FIG. 8B: Principle of colour stability represented on the 1931 C.I.E. chromaticity diagram. M is the resultant colour of a coating characterised by 2 reflection peaks, in the visible part of the solar spectrum, defined by $C_1$ and $C_2$ at low angle of vision. $C_{1'}$ and $C_{2'}$ are the corresponding colours for higher angle of vision. $M_D$ is the dominant colour of M.

Figure 9A:
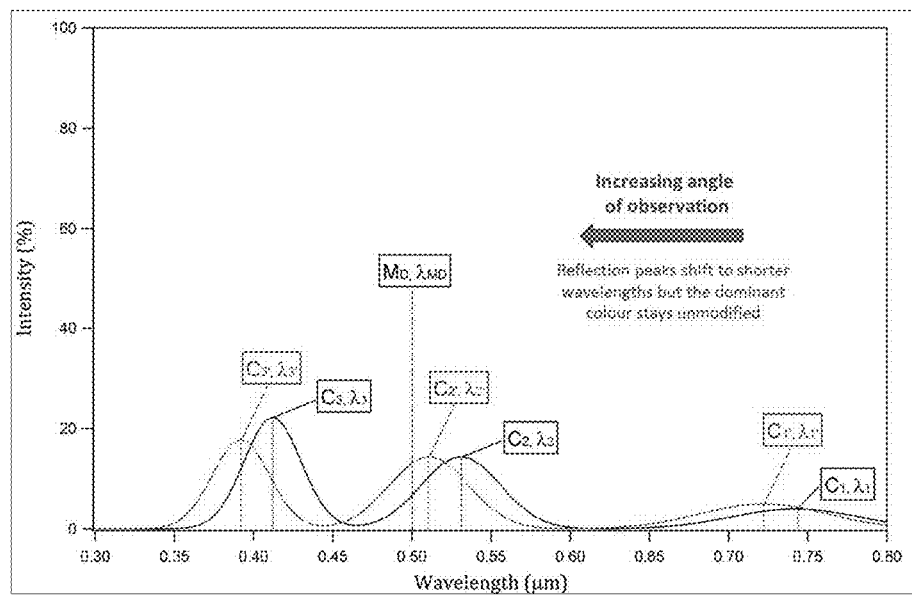

FIGS. 9A, 9B:

FIG. 9A: Graphical representation of a fictive reflectance curve composed by three reflection peaks in the visible part of the solar spectrum. $\lambda_1$, $C_1$, $\lambda_2$, $C_2$ and $\lambda_3$, $C_3$ are the wavelengths and colours of the reflectance peaks at low viewing angle. $\lambda_{1'}$, $C_{1'}$, $\lambda_{2'}$, $C_{2'}$ and $\lambda_{3'}$, $C_{3'}$ are the corresponding wavelengths and colours at higher angle of observation. The dominant colour $M_D$ of the coating is situated at $\lambda_D$ whose position depends on the relative intensity of all reflection peaks.

Figure 9B:
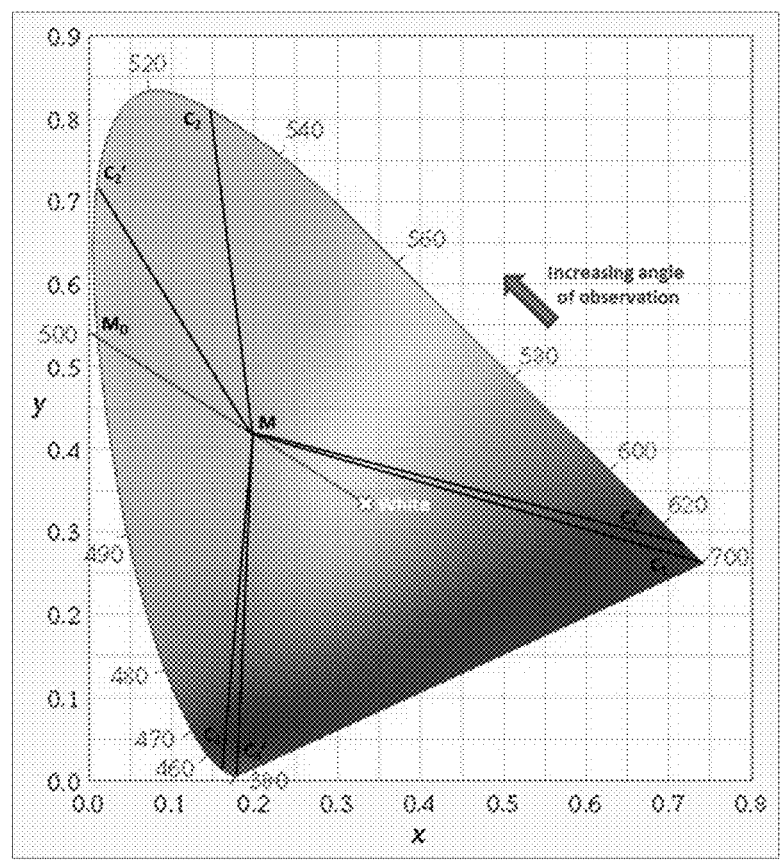
Figure 10:
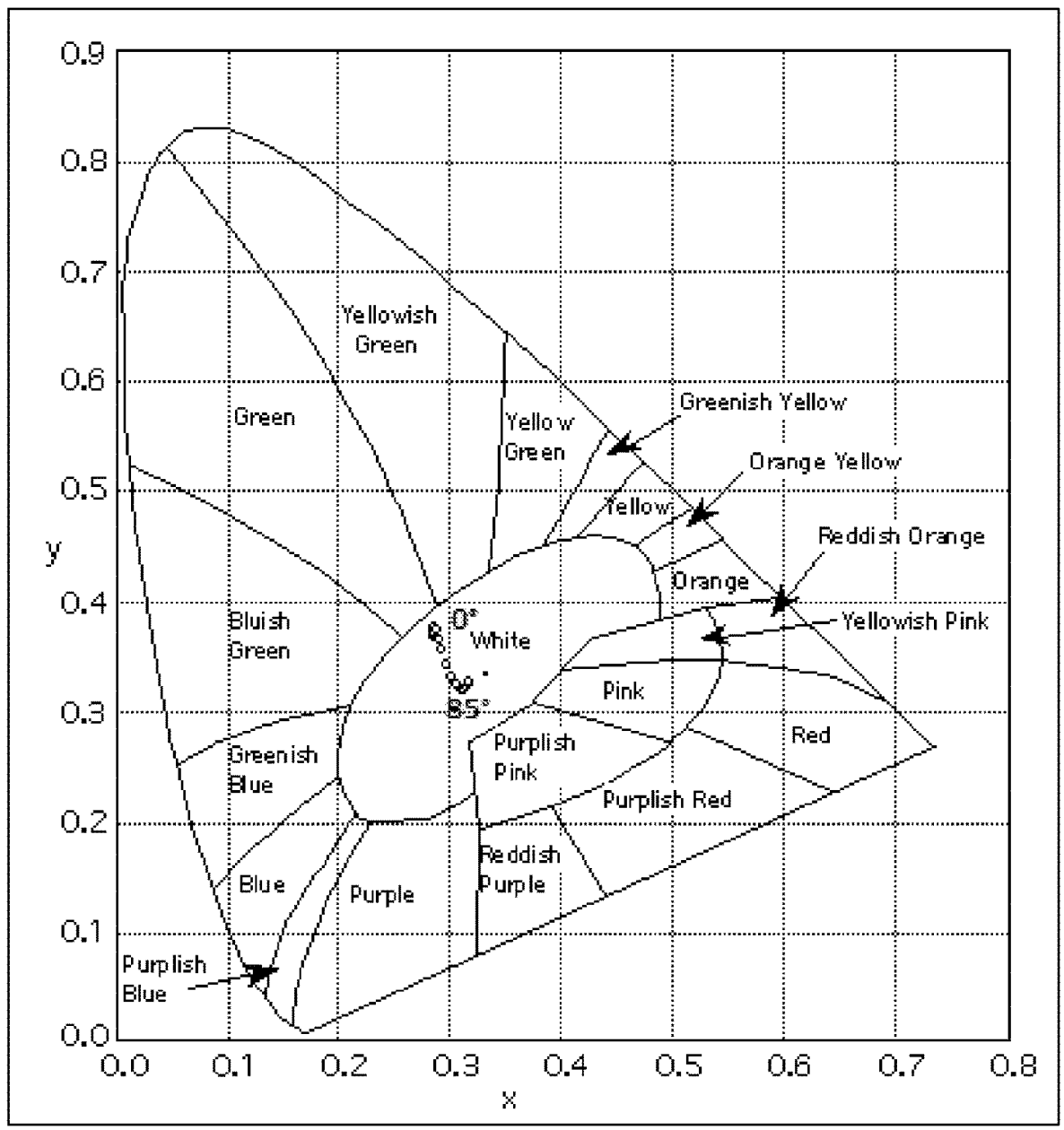
Figure 11:
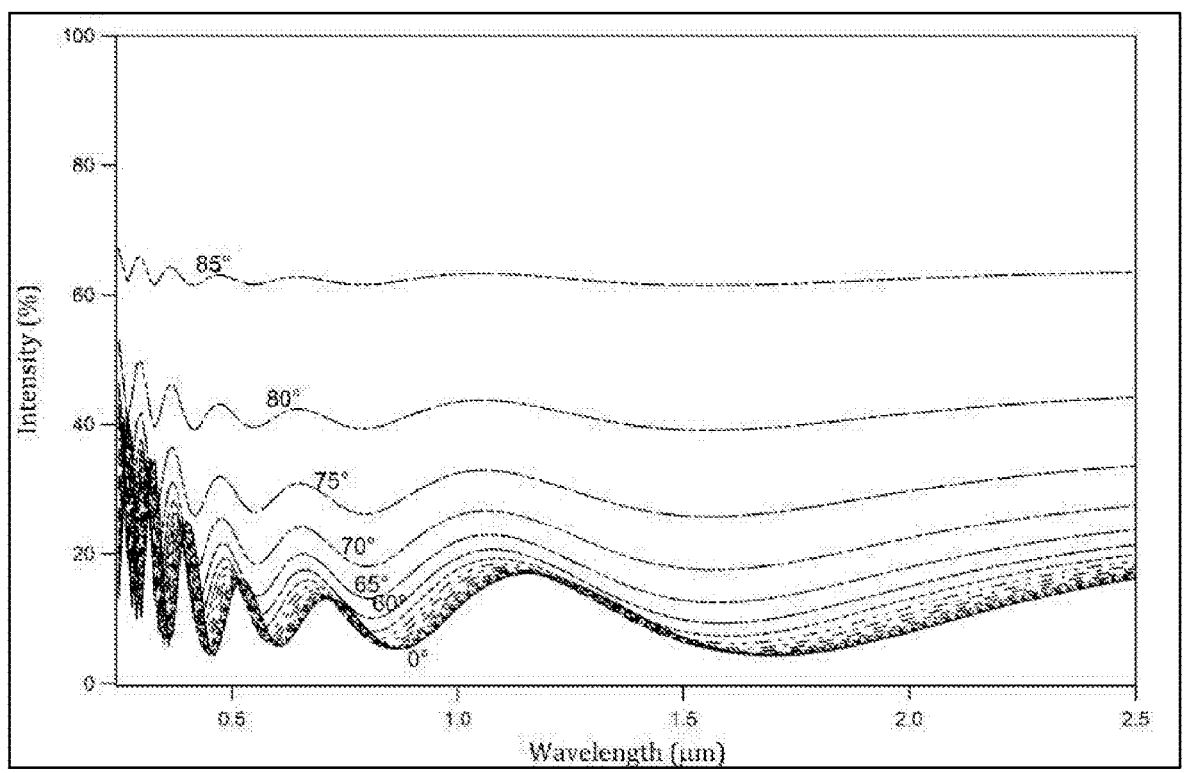
Figure 12:
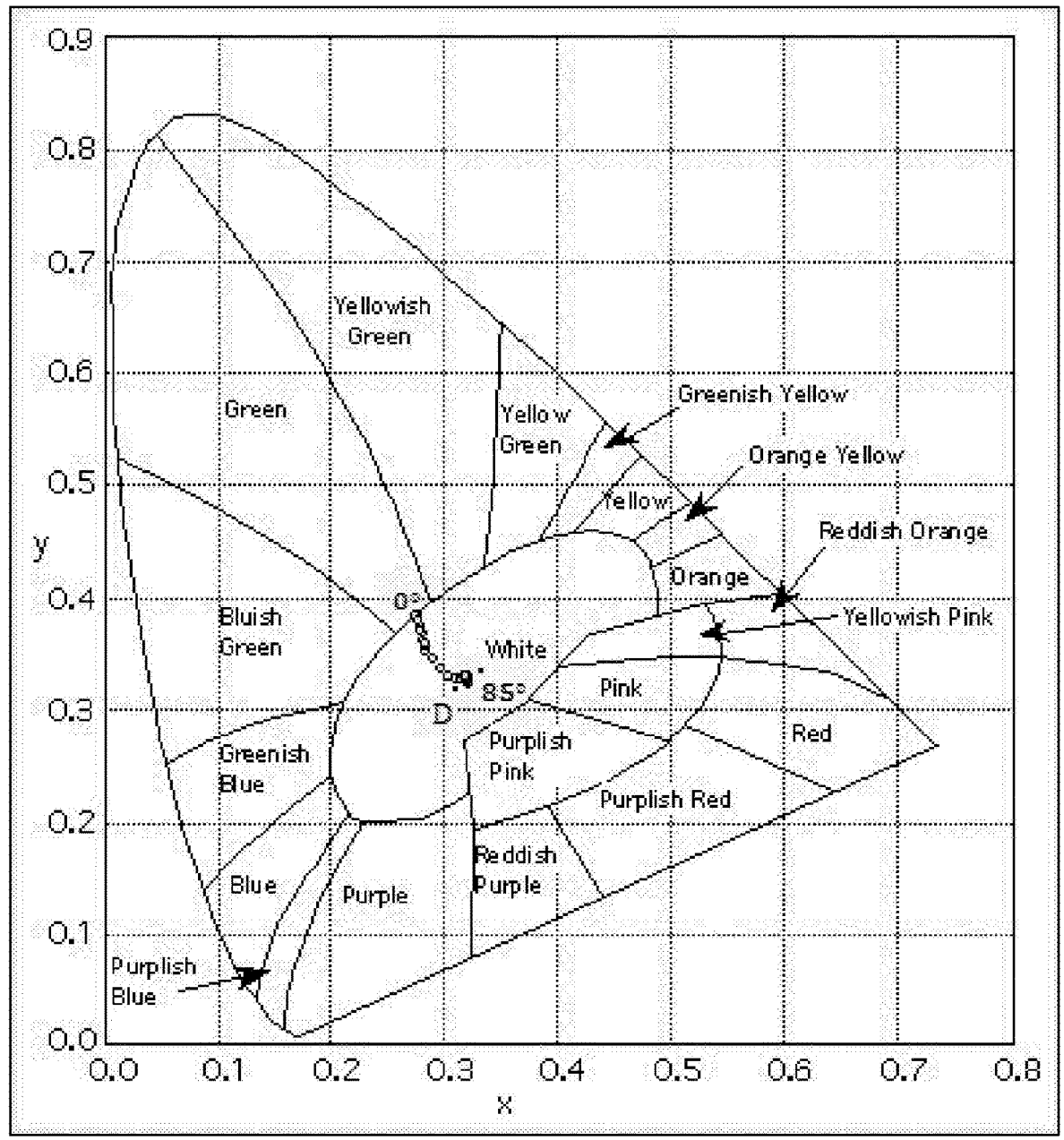
Figure 13:
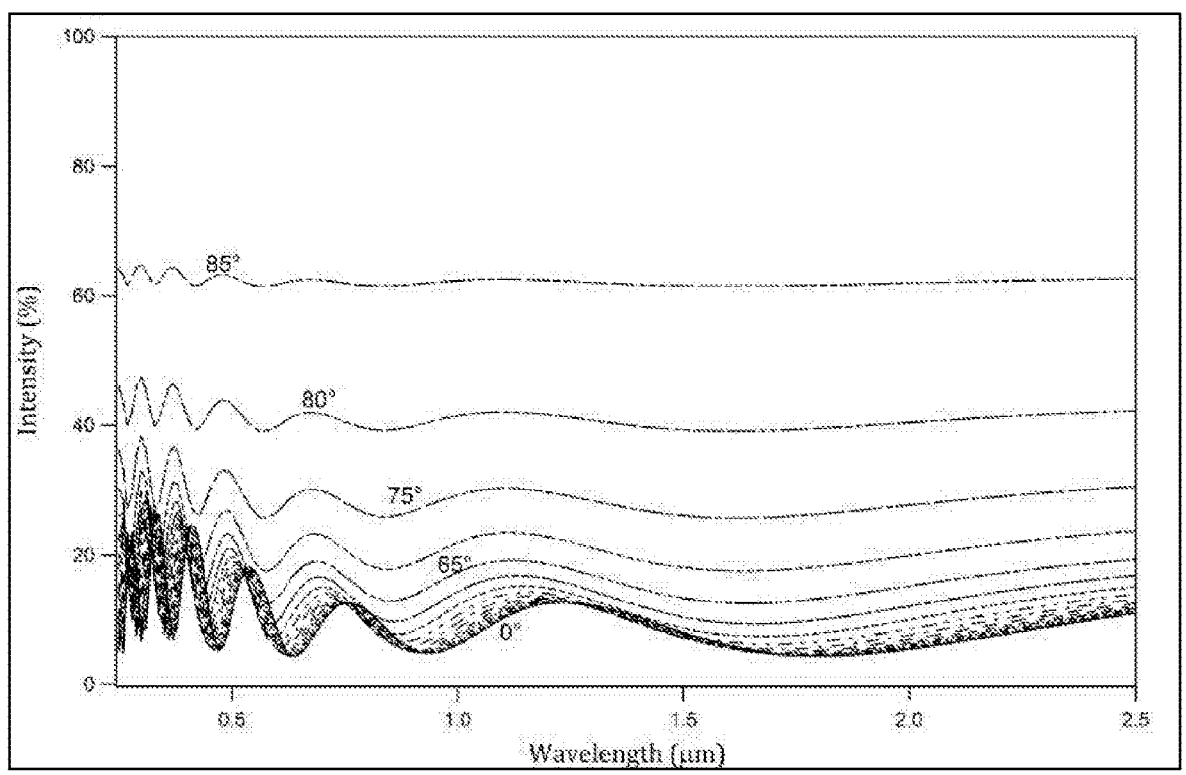
Figure 14:
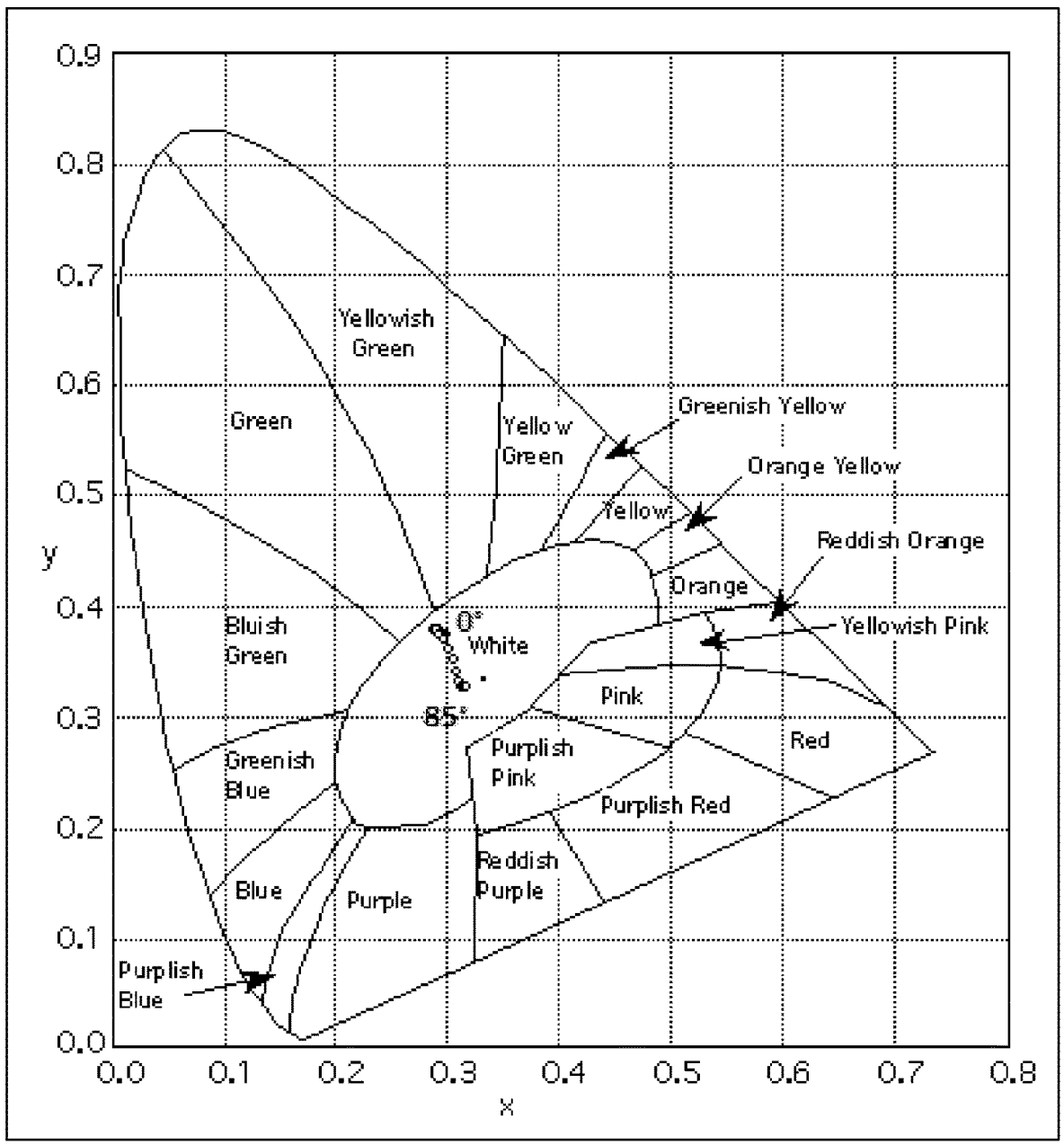
Figure 15:
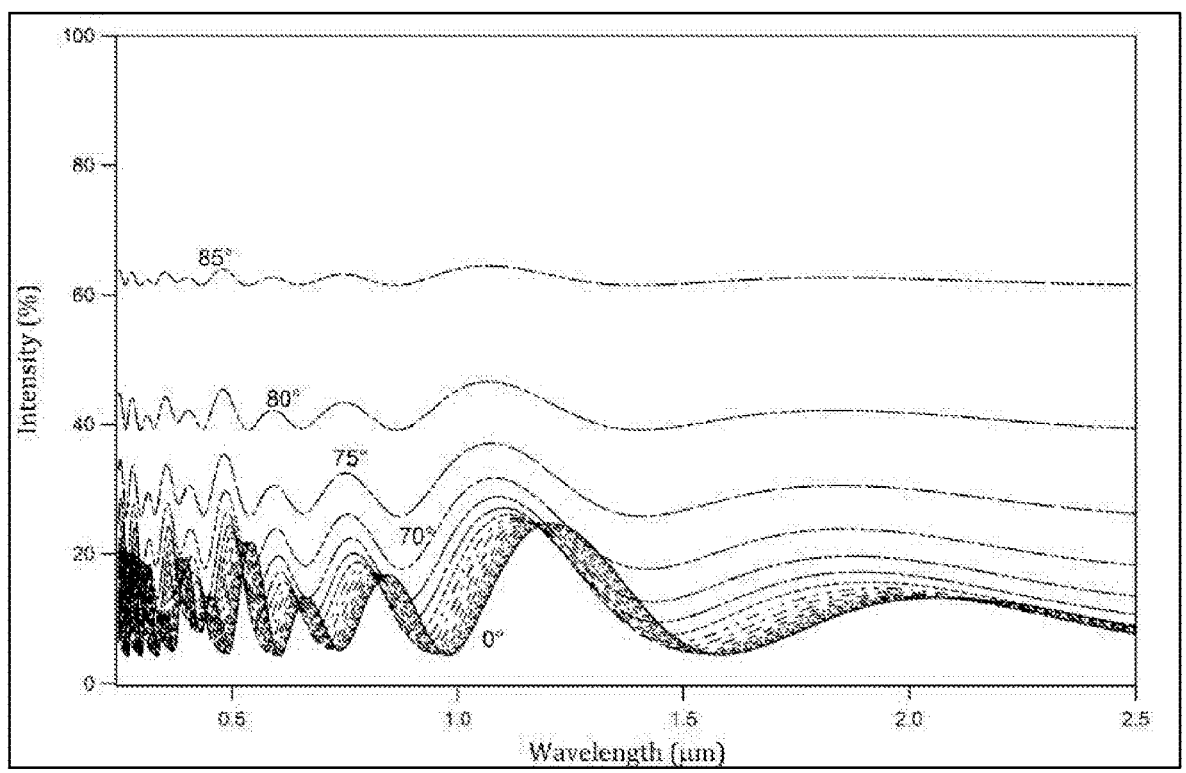
Figure 16:
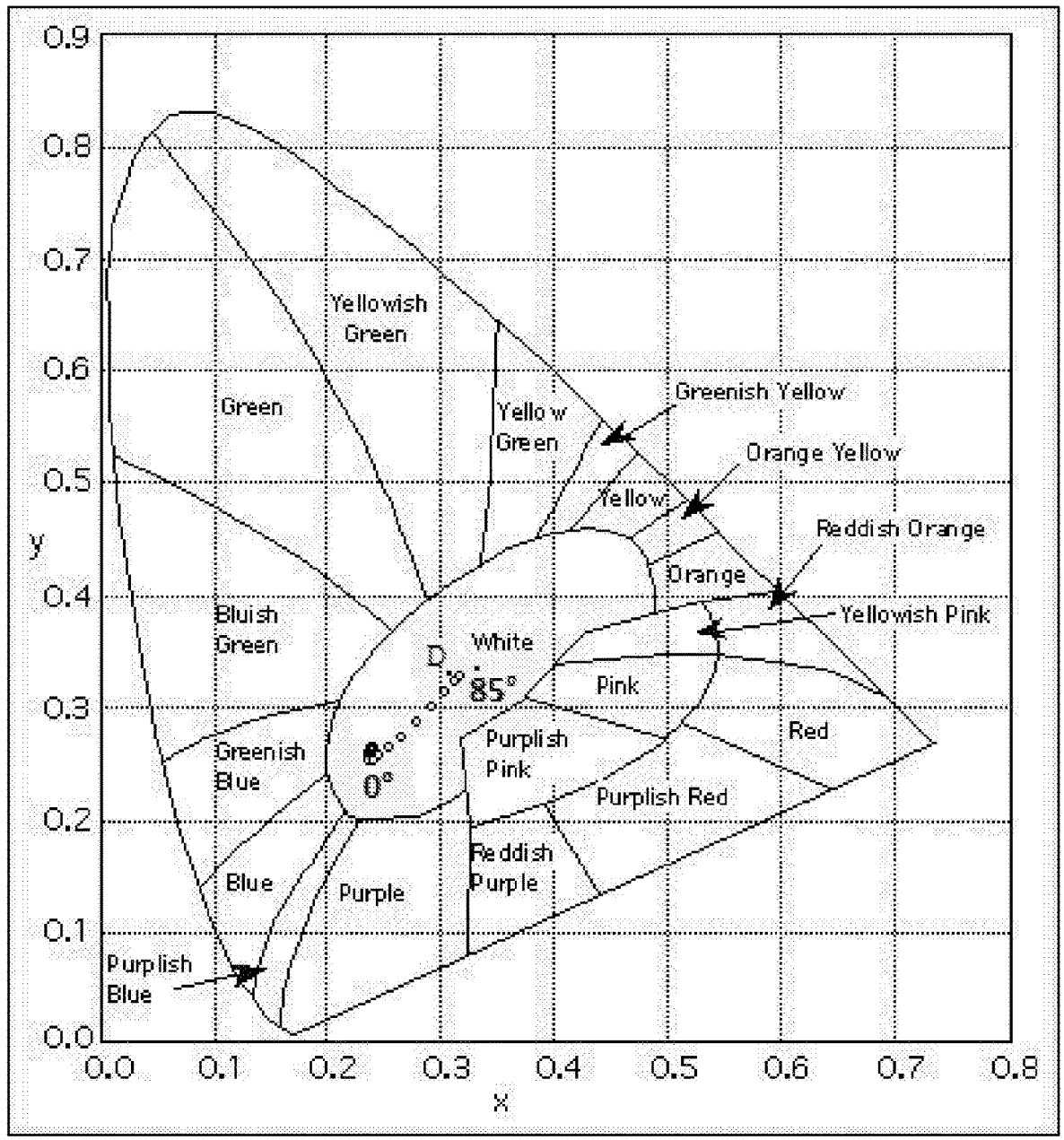
Figure 17:
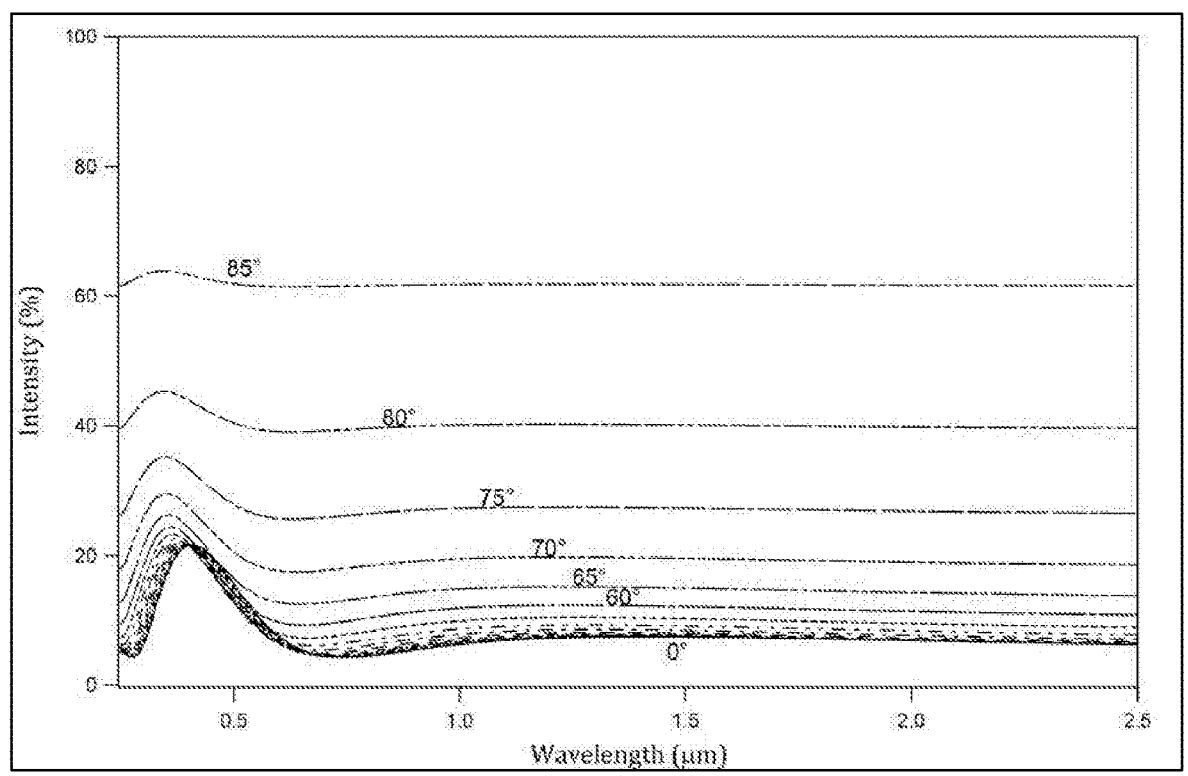
Figure 18:
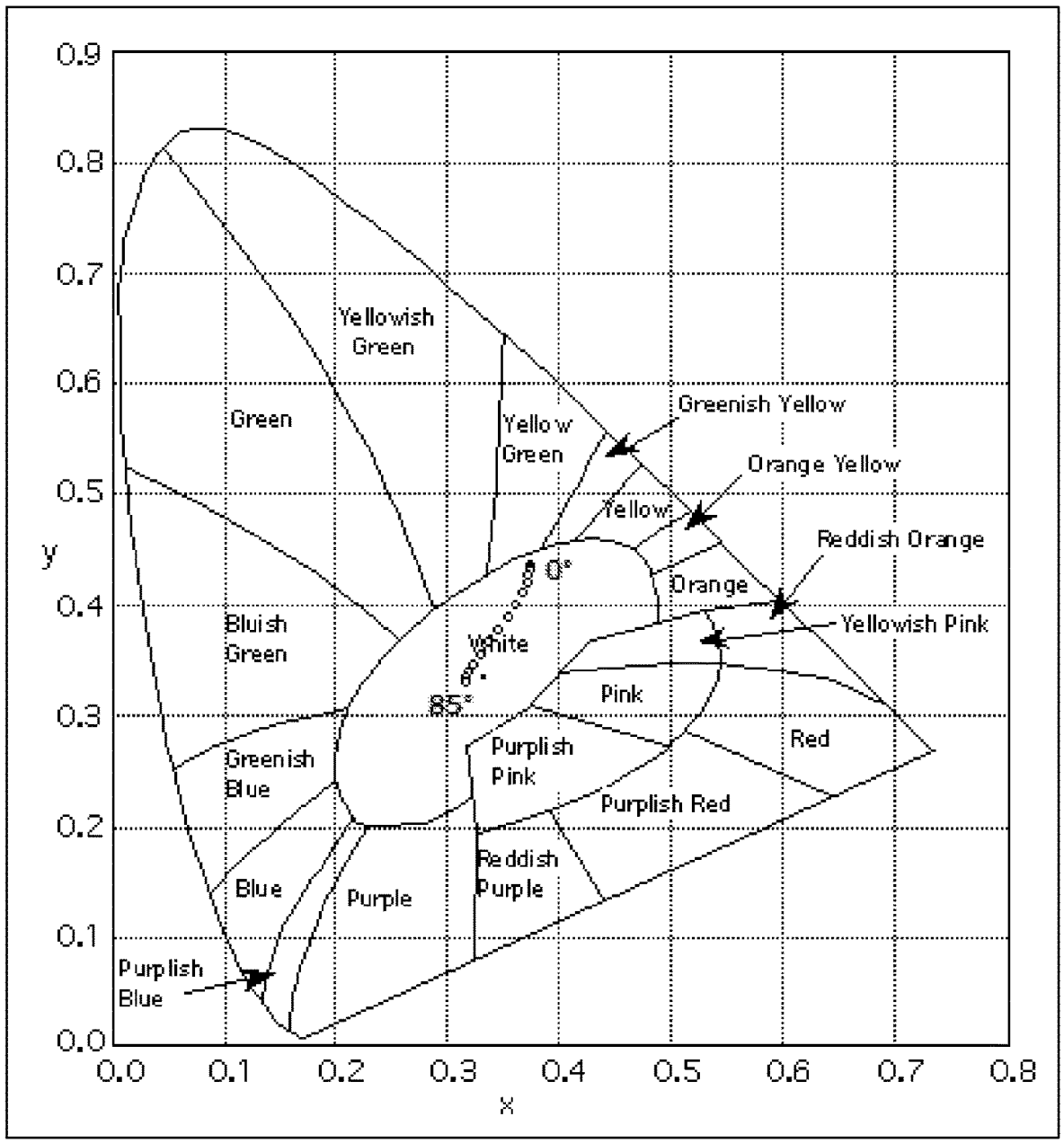
Figure 19:
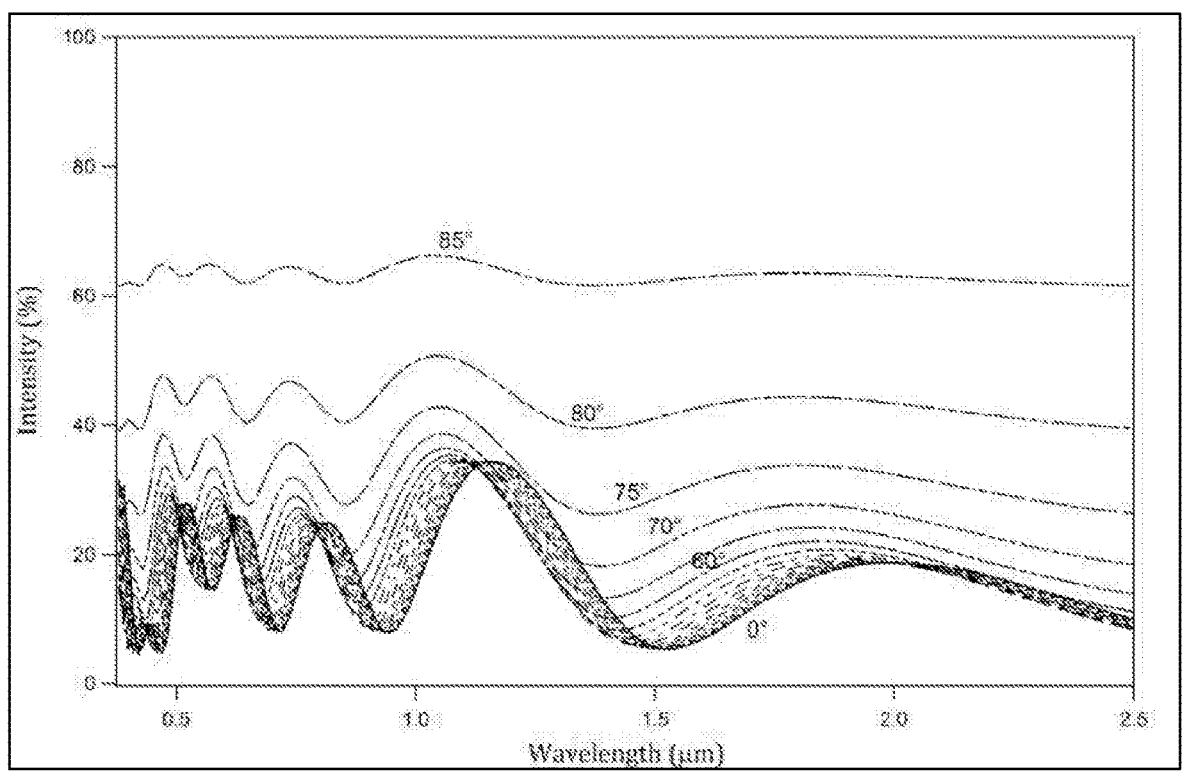
Figure 20:
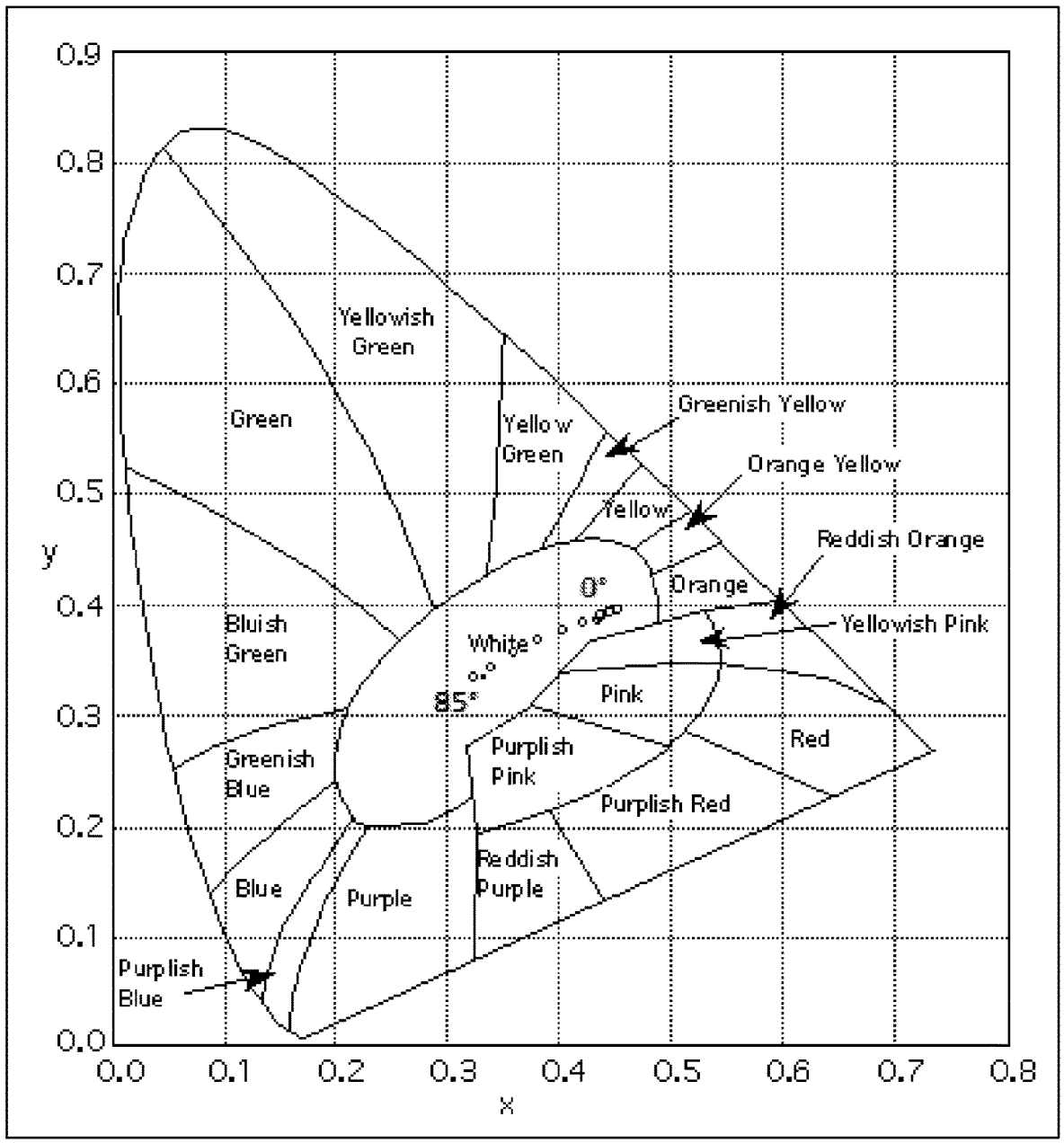
Figure 21:
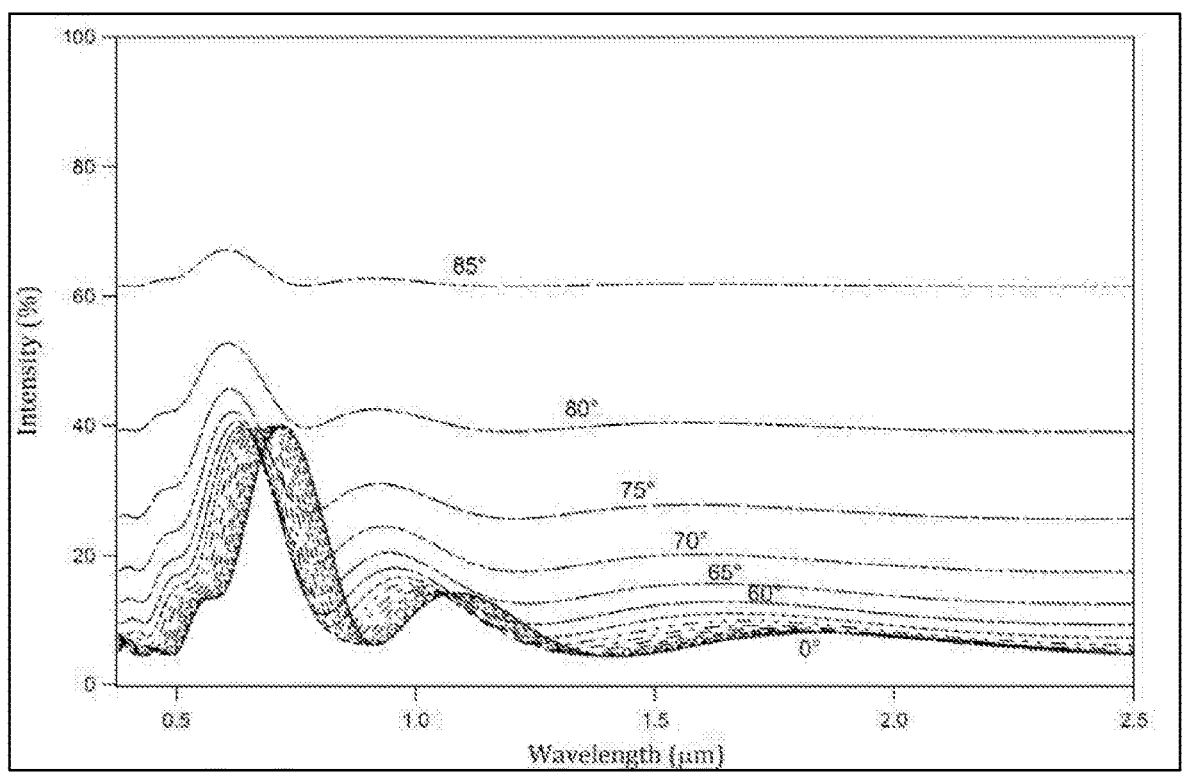
Figure 22:
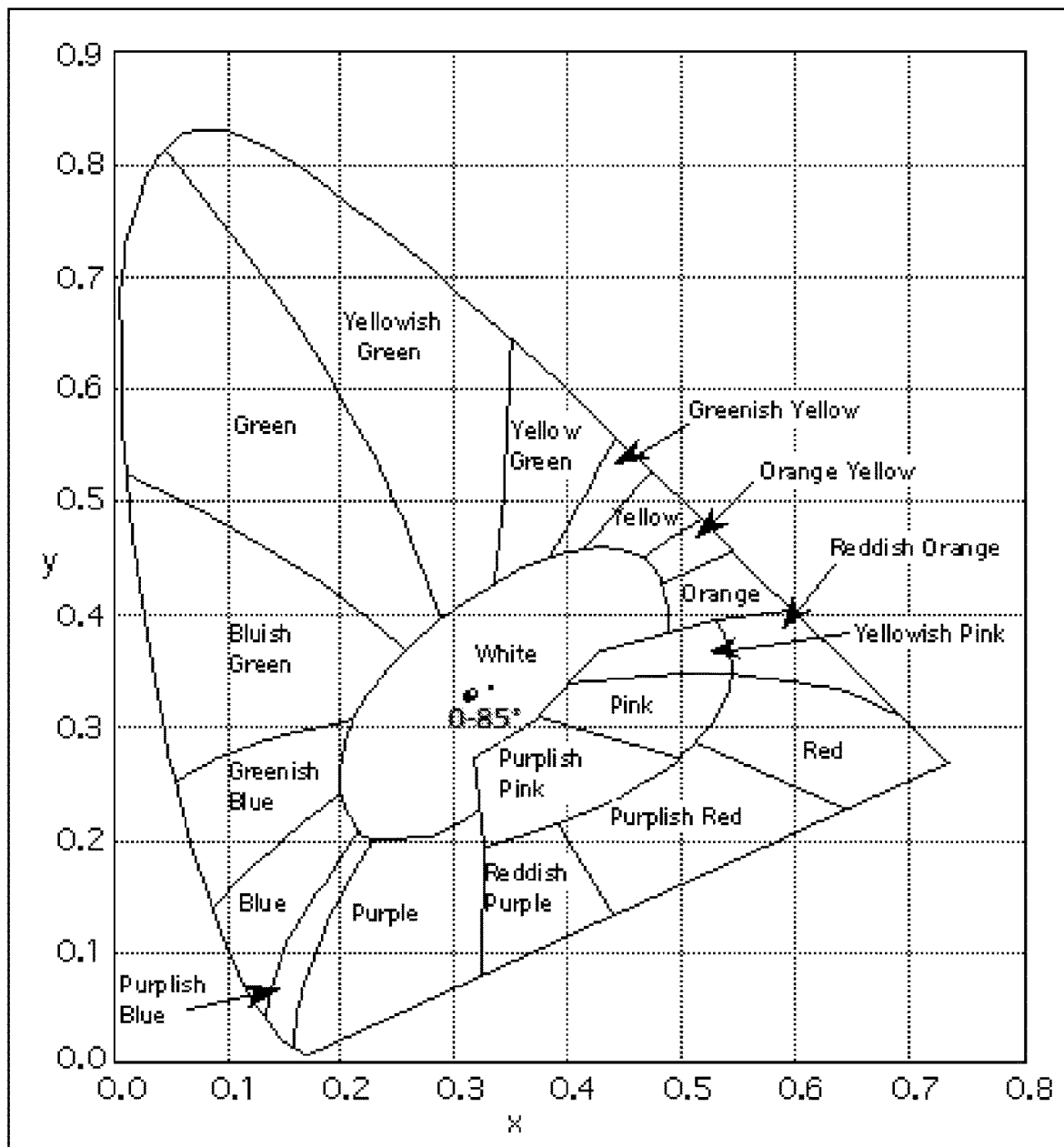
Figure 23:
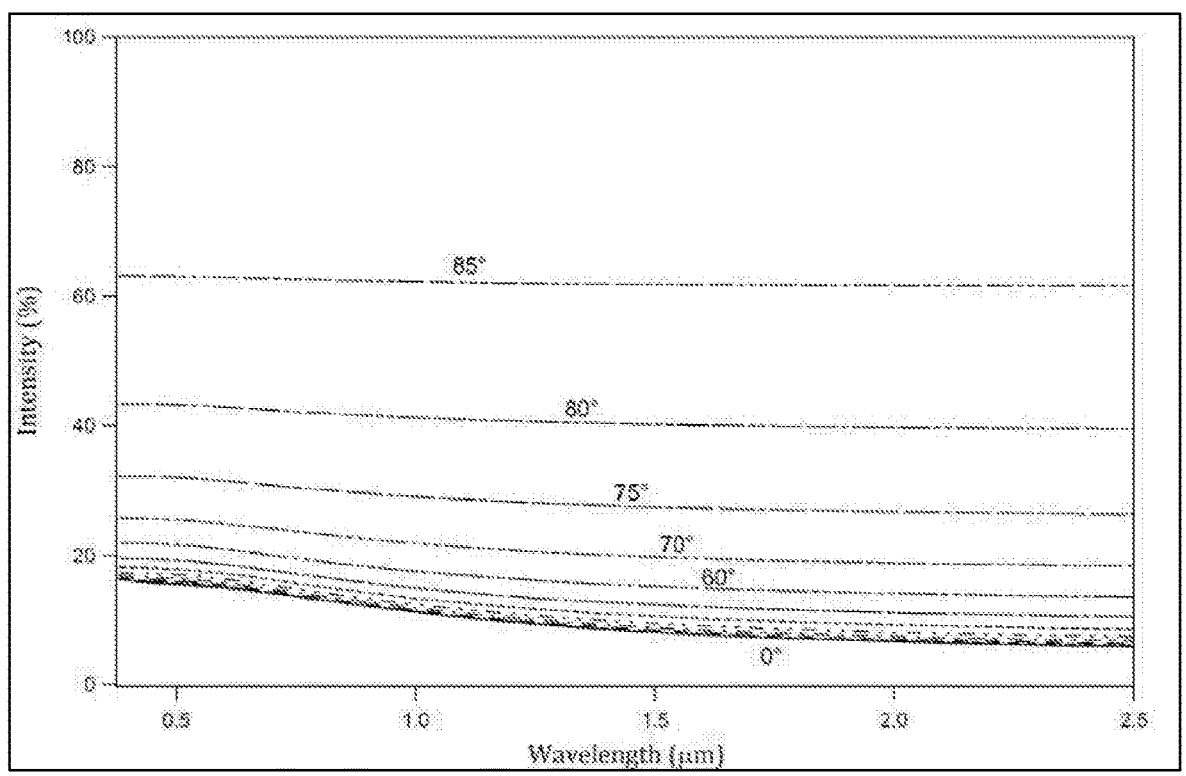
Figure 24:
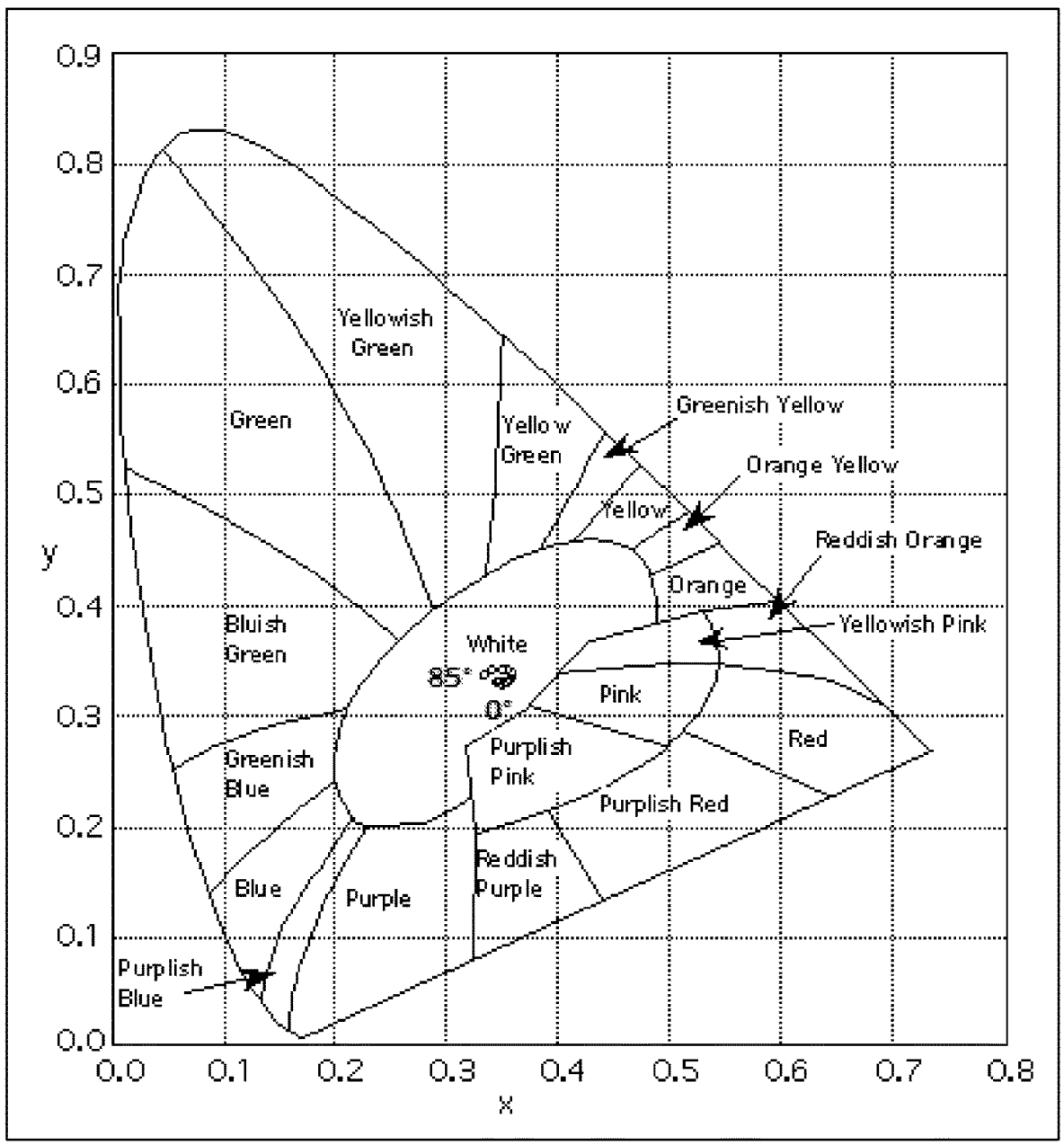
Figure 25:
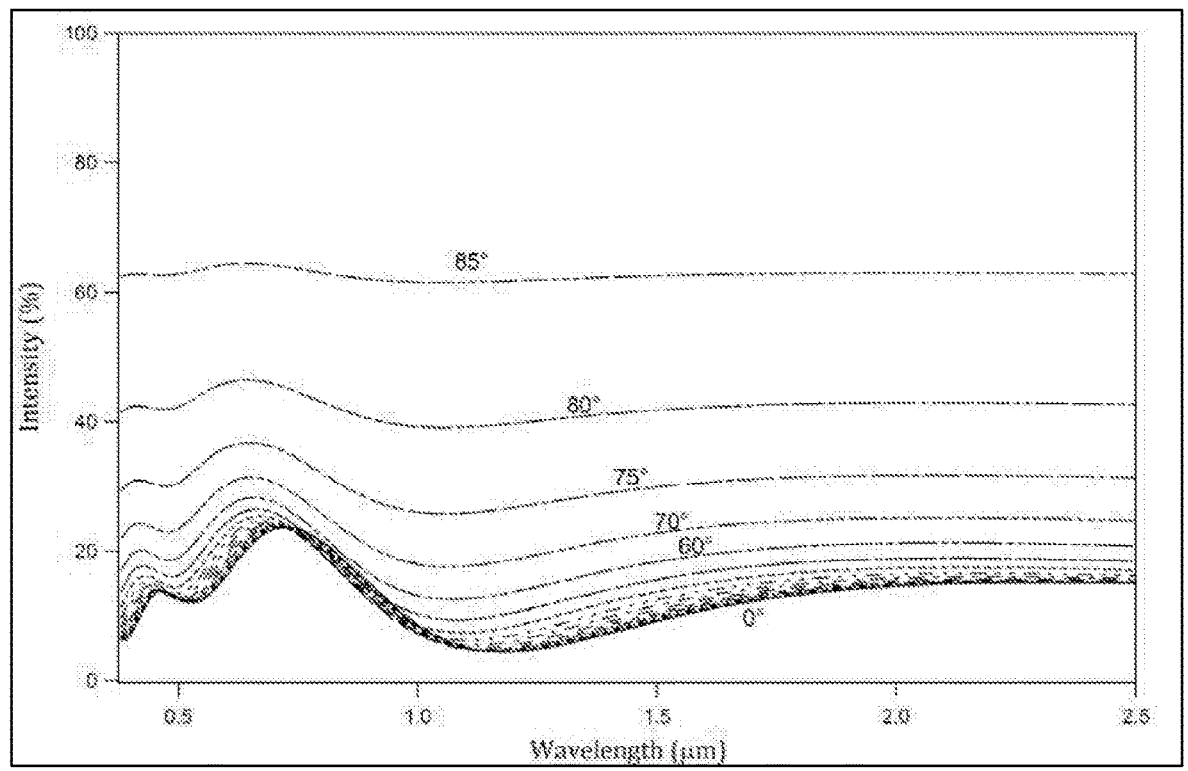

FIG. 9B: Principle of colour stability represented on the 1931 C.I.E. chromaticity diagram. M is the resultant colour of a coating characterised by 3 reflection peaks, in the visible part of the solar spectrum, defined by $C_1$, $C_2$ and $C_3$ at low angle of vision. $C_{1'}$, $C_{2'}$ and $C_{3'}$ are the corresponding colours for higher angle of vision. $M_D$ is the dominant colour of M.

FIG. 10:

Angular stability of 1931 CIE (x, y) colour coordinates under CIE-D65 illuminant of the coloured design given in Example 2.

FIG. 11:

Reflectance curves of the coating design given in Example 2 for various angles of reflection (from 0° to 85°).

FIG. 12:

Angular stability of 1931 CIE (x, y) colour coordinates under CIE-D65 illuminant of the coloured design given in Example 3.

FIG. 13:

Reflectance curves of the coating design given in Example 3 for various angles of reflection (from 0° to 85°).

FIG. 14:

Angular stability of 1931 CIE (x, y) colour coordinates under CIE-D65 illuminant of the coloured design given in Example 4.

FIG. 15:

Reflectance curves of the coating design given in Example 4 for various angles of reflection (from 0° to 85°).

FIG. 16:

Angular stability of 1931 CIE (x, y) colour coordinates under CIE-D65 illuminant of the coloured design given in Example 5.

FIG. 17:

Reflectance curves of the coating design given in Example 5 for various angles of reflection (from 0° to 85°).

FIG. 18:

Angular stability of 1931 CIE (x, y) colour coordinates under CIE-D65 illuminant of the coloured design given in Example 6.

FIG. 19:

Reflectance curves of the coating design given in Example 6 for various angles of reflection (from 0° to 85°).

FIG. 20:

Angular stability of 1931 CIE (x, y) colour coordinates under CIE-D65 illuminant of the coloured design given in Example 7.

FIG. 21:

Reflectance curves of the coating design given in Example 7 for various angles of reflection (from 0° to 85°).

FIG. 22:

Angular stability of 1931 CIE (x, y) colour coordinates under CIE-D65 illuminant of the coloured design given in Example 8.

FIG. 23:

Reflectance curves of the coating design given in Example 8 for various angles of reflection (from 0° to 85°).

FIG. 24:

Angular stability of 1931 CIE (x, y) colour coordinates under CIE-D65 illuminant of the coloured design given in Example 9.

FIG. 25:

Reflectance curves of the coating design given in Example 9 for various angles of reflection (from 0° to 85°).

FIG. 26:

Normal hemispherical transmittance measurements of a glass etched by solution 1 (ABF/IPA/H$_2$O=30/10/60–15 min etch time), a glass etched by solution 2 (ABF/sucrose/H$_2$O=18/18/64–15 min etch time) and an untreated glass. The normal hemispherical transmittance is around 95% for both etched glasses and around 92% for the untreated glass.

FIGS. 27A, 27B:

SEM pictures of glass surfaces structured by ABF-based etching solutions:

FIG. 27A: ABF/IPA/H$_2$O=30/10/60–15 min etch time

Figure 27B:
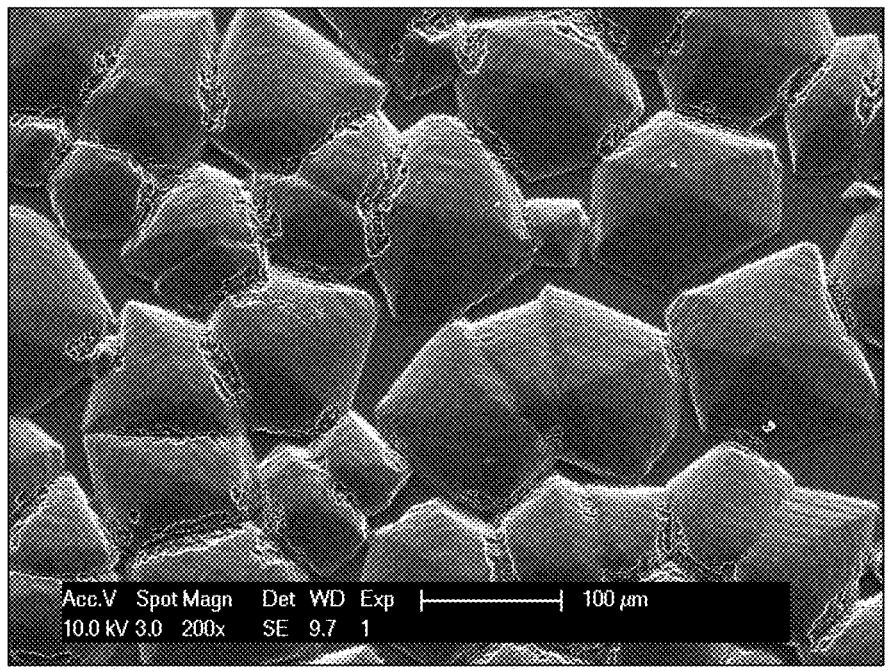

FIG. 27B: ABF/sucrose/H$_2$O=18/18/64–15 min etch time.

Figure 28C:
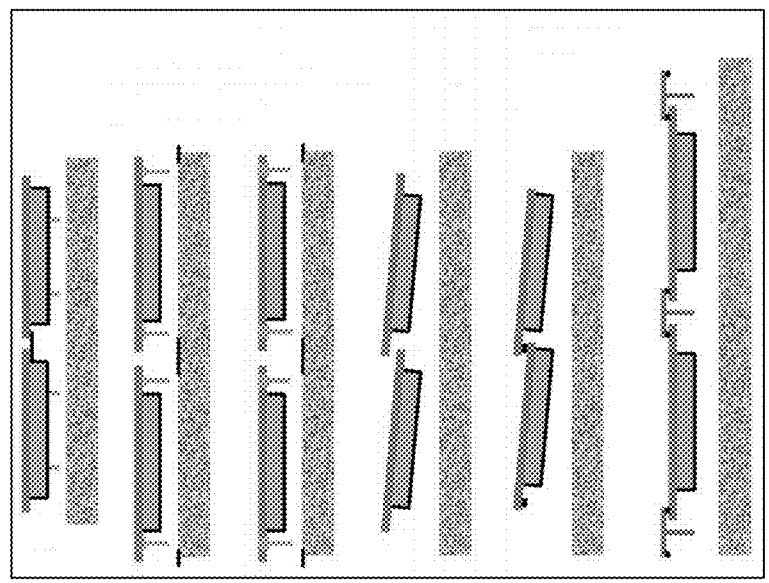

FIGS. 28A, 28B, and 28C:

Possible variations for the mounting of thermal or PVT solar systems glued behind a coloured laminated glazing: FIG. 28A—example of roof installation with glazing overlap, FIG. 28B—example of installation for residential ventilated facade, FIG. 28C—example of adaptation to large buildings with glass facades.

FIG. 29:

Illustration of the reflection angle $\theta_r$, incidence angle $\theta_i$ and transmission angle $\theta_t$.

EXAMPLES OF COATING DESIGNS

Example 1 air//136 nm of L/222 nm of H//glass//222 nm of H/136 nm of L//air
with $n_H$=1.54 and $n_L$=1.8

Example 2 air//glass//30 nm of H/25 nm of L/320 nm of H//polymer
with $n_H$=2.4 and $n_L$=1.65

Example 3 air//glass//185±12 nm of H/25±12 nm of L/35±12 nm of H/35±12 nm of L/130±12 nm of H//polymer
with $n_H$=2.4 and $n_L$=2.0

Example 4 air//glass//160±12 nm of H/130±12 nm of L/65±12 nm of H/25±12 nm of L/70±12 nm of H/160±12 nm of L/100±12 nm of H//polymer
with $n_H$=2.2 and $n_L$=2.0

Example 5 air//glass//45±12 nm of H/70±12 nm of L/45±12 nm of H//polymer
with $n_H$=2.0 and $n_L$=1.65

Example 6 air//glass//175±12 nm of H/85±12 nm of L/50±12 nm of H/25±12 nm of L/300±12 nm of H//polymer
with $n_H$=2.4 and $n_L$=2.0

Example 7 air//glass//120±12 nm of H/120±12 nm of L/95±12 nm of H/90±12 nm of L/90±12 nm of H/95±12 nm of L/100±12 nm of H//polymer
with $n_H$=2.0 and $n_L$=1.65

Example 8 air//glass//40±12 nm of H/75±12 nm of L//polymer
with $n_H$=2.4 and $n_L$=1.65

Example 9 air//glass//50±12 nm of H/90±12 nm of L/65±12 nm of H/55±12 nm of L//polymer
with $n_H$=2.4 and $n_L$=2.0

The invention claimed is:

1. A laminated glazing unit for architectural integration of solar energy systems, comprising:
   a layered glazing structure that includes
      a substrate having a substrate refractive index $n_{sub}$ a value of which at a wavelength of 550 nm is between 1.45 and 1.6;
      a multi-layered interference filter disposed on a first surface of the substrate and containing a non-quarter-wave thin-film stack defined at said wavelength of 550 nm, wherein thicknesses of any two high-index material layers sandwiching an immediately-adjacent low-index material layer therebetween are different from one another and wherein thicknesses of any two low-index material layers sandwiching an immediately-adjacent high-index material layer therebetween are different from one another; wherein the high-index layers each have a refractive index from 1.8 to 2.5 and the low-refractive index layers each have a refractive index from 1.4 to 2.2 and
      a laminating polymer layer disposed on the multi-layered interference filter, said laminating polymer layer having a polymer refractive index $n_{pol}$ a value of which at the wavelength of 550 nm between 1.45 and 1.6;
   wherein said layered glazing structure, when the substrate is in contact with an incident medium having a refractive index of $n_{inc}$=1, is characterized by:
      a) a first reflectance value for IR light at every wavelength between 1 micron and 2.5 micron that is between 65% and 17% for at least angles of reflection of zero degrees,—65 degrees, 70 degrees, 75 degrees, 80 degrees, and 85 degrees;
   and
      b) a value of saturation of color, given by $C^*_{ab}=\sqrt{(a^*)^2+(b^*)^2}$ according to CIE color coordinates L*, a* and b* under daylight illumination CIE-D65 that is higher than 8 at normal angle of reflection, except for grey and brown;
   and
      c) a second reflectance value $R_{vis}$ for light in a visible portion of an optical spectrum at near-normal incidence that is higher than 4%;
   and
      d) a variation of a dominant wavelength $\lambda_{MD}$ of a dominant color, characterizing said light in the visible portion of the optical spectrum that is reflected by the layered glazing structure at an angle $\theta_r$ of less than 15 nm for every $\theta_r$<60°;
   and
      e) a total hemispherical solar transmittance above 80% at normal incidence.

2. The glazing unit according to claim 1,
the first reflectance value for IR light at every wavelength between 1 micron and 2.5 micron is between 20% and 13.2% for at least the angles of reflection of said IR light of zero degrees, 60 degrees, and 65 degrees.

3. The glazing unit according to claim 1, wherein a second surface of the substrate contains a surface micro-structure or a surface nano-structure configured as a light diffuser for light at wavelengths in the visible portion the optical spectrum.

4. The glazing unit according to claim 1, wherein the layered glazing structure includes an anti-reflection (AR) coating at a backside of the laminated glazing structure, said AR coating configured to ensure that a solar transmittance for light that has passed through the substrate, the multi-layered interference filter, and through the laminating polymer layer to interact with exposed surface is increased by about 3% after said AR coating is disposed.

5. The glazing according to claim 1, wherein the substrate comprises solar roll glass, an extra-white float glass with iron content of less than 120 ppm, or a polymeric material characterized by a solar transmittance higher than 90%.

6. The glazing unit according to claim 1,
wherein the laminating polymer layer comprises an elastomer cross-linking polymer, a thermoplastic product, or an ionoplastic polymer, and
further comprising a pane of glass or polymer material laminated with said layered glazing structure via said laminating polymer layer,
wherein the total hemispherical solar transmittance of the article is higher than 92% when a thickness of the laminating polymer layer is between 0.4 mm and 0.5 mm.

7. The glazing unit according to claim 1,
wherein said multi-layered interference filter includes a thin-film stack of up to 9 layers that have corresponding physical thicknesses of up to 400 nm, wherein materials of said layers have corresponding extinction coefficients k not exceeding 0.2 at every wavelength between 450 nm and 2,500 nm.

8. The glazing unit according to claim 1,
wherein the substrate includes glass or polymer,
wherein said multi-layered interference filter includes a spatially-asymmetric filter that includes 3 thin-film layers such that the layered glazing structure is configured to satisfy a design of
incident medium of air|the substrate |H1|L1|H2| exit medium of said polymer layer,
wherein H1 denotes a layer of a high-refractive-index material with a refractive index of $1.8 \leq n_{H1} \leq 2.5$ at the wavelength of 550 nm and a first physical thickness of 30±12 nm,
wherein L1 denotes a layer of a low-refractive-index material with a refractive index of $1.4 \leq n_{L1} \leq 2.2$ at the wavelength of 550 nm and a second physical thickness of 25±12 nm,
wherein H2 denotes a layer of the high-refractive-index material with the refractive index of $1.8 \leq n_{H2} \leq 2.5$ at the wavelength of 550 nm and a third physical thickness of 320±12 nm,
and
wherein light incident onto the substrate and reflected by said glazing unit is perceived as green.

9. The glazing unit according to claim 1,
wherein the substrate includes glass or polymer,
wherein said multi-layered interference filter is a spatially-asymmetric filter that includes 5 thin-film layers such that the layered glazing structure is configured to satisfy a design of
incident medium of air|the substrate |H1|L1|H2|L2|H3 exit medium of said polymer layer,
wherein H1 denotes a layer of a high-refractive-index material with a refractive index of $1.8 \leq n_{H1} \leq 2.5$ at the wavelength of 550 nm and a first physical thickness of 185±12 nm,
wherein L1 denotes a layer of a low-refractive-index material with a refractive index of $1.4 \leq n_{L1} \leq 2.2$ at the wavelength of 550 nm and a second physical thickness of 25±12 nm,
wherein H2 denotes a layer of the high-refractive-index material with the refractive index of $1.8 \leq n_{H2} \leq 2.5$ at the wavelength of 550 nm and a third physical thickness of 35±12 nm, and
wherein L2 denotes a layer of the low-refractive-index material with a refractive index of $1.4 \leq n_{L2} \leq 2.2$ at the wavelength of 550 nm and a fourth physical thickness of 35±12 nm,
wherein H3 denotes a layer of the high-refractive-index material with the refractive index of $1.8 \leq n_{H3} \leq 2.5$ at the wavelength of 550 nm and a fifth physical thickness of 130±12 nm,
and
wherein light incident onto the substrate and reflected by said glazing unit is perceived as green.

10. The glazing unit according to claim 1,
wherein the substrate includes glass or polymer,
wherein said multi-layered interference filter is a spatially-asymmetric filter that includes 7 thin-film layers such that the layered glazing structure is configured to satisfy a design of
incident medium of air|the substrate |H1|L1|H2|L2|H3|L3|H4| exit medium of said polymer layer,
wherein H1 denotes a layer of a high-refractive-index material with a refractive index of $1.8 \leq n_{H1} \leq 2.5$ at the wavelength of 550 nm and a first physical thickness of 160±12 nm,
wherein L1 denotes a layer of a low-refractive-index material with a refractive index of $1.4 \leq n_{L1} \leq 2.2$ at the wavelength of 550 nm and a second physical thickness of 130±12 nm,
wherein H2 denotes a layer of the high-refractive-index material with the refractive index of $1.8 \leq n_{H2} \leq 2.5$ at the wavelength of 550 nm and a third physical thickness of 65±12 nm, and
wherein L2 denotes a layer of the low-refractive-index material with a refractive index of $1.4 \leq n_{L2} \leq 2.2$ at the wavelength of 550 nm and a fourth physical thickness of 25±12 nm,
wherein H3 denotes a layer of the high-refractive-index material with the refractive index of $1.8 \leq n_{H3} \leq 2.5$ at the wavelength of 550 nm and a fifth physical thickness of 70±12 nm,
wherein L3 denotes a layer of the low-refractive-index material with a refractive index of $1.4 \leq n_{L3} \leq 2.2$ at the wavelength of 550 nm and a fourth physical thickness of 160±12 nm, wherein H4 denotes a layer of the high-refractive-index material with the refractive index of $1.8 \leq n_{H4} \leq 2.5$ at the wavelength of 550 nm and a fifth physical thickness of 100±12 nm, and wherein light incident onto the substrate and reflected by said glazing unit is perceived as green.

11. The glazing unit according to claim 1, wherein the substrate includes glass or polymer, wherein said multi-layered interference filter includes 3 thin-film layers such that the layered glazing structure is configured to satisfy a design of incident medium of air|the substrate |H1|L1|H2| exit medium of said polymer layer, wherein H1 denotes a layer of a high-refractive-index material with a refractive index of $1.8 \leq n_{H1} \leq 2.5$ S at the wavelength of 550 nm and a first physical thickness of 45±12 nm, wherein L denotes a layer of a low-refractive-index material with a refractive index of $1.4 \leq n_{L1} \leq 2.2$ at the wavelength of 550 nm and a second physical thickness of 70±12 nm, wherein H2 denotes a layer of the high-refractive-index material with the refractive index of $1.8 \leq n_{H2} \leq 2.5$ at the wavelength of 550 nm and a third physical thickness of 45±12 nm, and wherein light incident onto the substrate and reflected by said glazing unit is perceived as green.

12. The glazing unit according to claim 1, wherein the substrate includes glass or polymer, wherein said multi-layered interference filter is a spatially-asymmetric filter that includes 5 thin-film layers such that the layered glazing structure is configured to satisfy a design of incident medium of air|the substrate |H1|L1|H2|L2|H3 exit medium of said polymer layer, wherein H1 denotes a layer of a high-refractive-index material with a refractive index of $1.8 \leq n_{H1} \leq 2.5$ at the wavelength of 550 nm and a first physical thickness of 175±12 nm, wherein L1 denotes a layer of a low-refractive-index material with a refractive index of $1.4 \leq n_{L1} \leq 2.2$ at the wavelength of 550 nm and a second physical thickness of 85±12 nm, wherein H2 denotes a layer of the high-refractive-index material with the refractive index of $1.8 \leq n_{H2} \leq 2.5$ at the wavelength of 550 nm and a third physical thickness of 50±12 nm, and wherein L2 denotes a layer of the low-refractive-index material with a refractive index of $1.4 \leq n_{L2} \leq 2.2$ at the wavelength of 550 nm and a fourth physical thickness of 25±12 nm, wherein H3 denotes a layer of the high-refractive-index material with the refractive index of $1.8 \leq n_{H3} \leq 2.5$ at the wavelength of 550 nm and a fifth physical thickness of 300±12 nm, and wherein light incident onto the substrate and reflected by said glazing unit is perceived as yellow-green.

13. The glazing unit according to claim 1, wherein the substrate includes glass or polymer, wherein said multi-layered interference filter is a spatially-asymmetric filter that includes 7 thin-film layers such that the layered glazing structure is configured to satisfy a design of incident medium of air|the substrate |H1|L1|H2|L2|H3|L3|H4| exit medium of said polymer layer, wherein H1 denotes a layer of a high-refractive-index material with a refractive index of $1.8 \leq n_{H1} \leq 2.5$ at the wavelength of 550 nm and a first physical thickness of 120±12 nm, wherein L1 denotes a layer of a low-refractive-index material with a refractive index of $1.4 \leq n_{L1} \leq 2.2$ at the wavelength of 550 nm and a second physical thickness of 120±12 nm, wherein H2 denotes a layer of the high-refractive-index material with the refractive index of $1.8 \leq n_{H2} \leq 2.5$ at the wavelength of 550 nm and a third physical thickness of 95±12 nm, and wherein L2 denotes a layer of the low-refractive-index material with a refractive index of $1.4 \leq n_{L2} \leq 2.2$ at the wavelength of 550 nm and a fourth physical thickness of 90±12 nm, wherein H3 denotes a layer of the high-refractive-index material with the refractive index of $1.8 \leq n_{H3} \leq 2.5$ at the wavelength of 550 nm and a fifth physical thickness of 90±12 nm, wherein L3 denotes a layer of the low-refractive-index material with a refractive index of $1.4 \leq n_{L3} \leq 2.2$ at the wavelength of 550 nm and a fourth physical thickness of 95±12 nm, wherein H4 denotes a layer of the high-refractive-index material with the refractive index of $1.8 \leq n_{H4} \leq 2.5$ at the wavelength of 550 nm and a fifth physical thickness of 100±12 nm, and wherein light incident onto the substrate and reflected by said glazing unit is perceived as yellow-orange.

14. The glazing unit according to claim 1, wherein the substrate includes glass or polymer, wherein said multi-layered interference filter includes 2 thin-film layers such that the layered glazing structure is configured to satisfy a design of incident medium of air the substrate |H1|L1 exit medium of said polymer layer, wherein H1 denotes a layer of a high-refractive-index material with a refractive index of $1.8 \leq n_{H1} \leq 2.5$ at the wavelength of 550 nm and a first physical thickness of 40±15 nm, wherein L1 denotes a layer of a low-refractive-index material with a refractive index of $1.4 \leq n_{L1} \leq 2.2$ at the wavelength of 550 nm and a second physical thickness of 75±30 nm, and wherein light incident onto the substrate and reflected by said glazing unit is perceived as gray.

15. The glazing unit article of manufacture according to claim 1, wherein the substrate includes glass or polymer, wherein said multi-layered interference filter is a spatially-asymmetric filter that includes 4 thin-film layers such that the layered glazing structure is configured to satisfy a design of incident medium of air|the substrate |H1|L1|H2|L2| exit medium of said polymer layer, wherein H1 denotes a layer of a high-refractive-index material with a refractive index of $1.8 \leq n_{H1} \leq 2.5$ at the wavelength of 550 nm and a first physical thickness of 50±12 nm, wherein L1 denotes a layer of a low-refractive-index material with a refractive index of $1.4 \leq n_{L1} \leq 2.2$ at the wavelength of 550 nm and a second physical thickness of 90±12 nm, wherein H2 denotes a layer of a high-refractive-index material with a refractive index of $1.8 \leq n_{H2} \leq 2.5$ at the wavelength of 550 nm and a first physical thickness of 65±12 nm, wherein L2 denotes a layer of a low-refractive-index material with a refractive index of $1.4 \leq n_{L2} \leq 2.2$ at the wavelength of 550 nm and a second physical thickness of 55±12 nm, and wherein light incident onto the substrate and reflected by said glazing unit is perceived as brown.

16. The glazing unit according to claim 1, further comprising a solar thermal collector or a solar photovoltaic (PV) panel disposed to be separated from the multi-layered interference filter by the laminating polymer layer.

17. The glazing unit according to claim 16, wherein said solar thermal collector and said laminating polymer layer are in direct contact with one another.

18. The glazing unit according to claim 16, wherein an active element of the solar PV panel is fully integrated in the layered glazing structure.

* * * * *